US012804859B2

(12) United States Patent
VanGilder et al.

(10) Patent No.: US 12,804,859 B2
(45) Date of Patent: Nov. 17, 2026

(54) SYSTEMS AND METHODS FOR ASSESSING COOLING PERFORMANCE IN A SPACE CONTAINING ONE OR MORE INFORMATION TECHNOLOGY (IT) EQUIPEMENTS AND ONE OR MORE COOLING UNITS

(71) Applicant: SCHNEIDER ELECTRIC IT CORPORATION, Foxboro, MA (US)

(72) Inventors: James William VanGilder, Pepperell, MA (US); Michael B. Condor, Chelmsford, MA (US)

(73) Assignee: SCHNEIDER ELECTRIC IT CORPORATION, Foxboro, MA (US)

( * ) Notice: Subject to any disclaimer, the term of this patent is extended or adjusted under 35 U.S.C. 154(b) by 288 days.

(21) Appl. No.: 18/526,781

(22) Filed: Dec. 1, 2023

(65) Prior Publication Data

US 2024/0114668 A1 Apr. 4, 2024

Related U.S. Application Data

(63) Continuation-in-part of application No. 17/457,468, filed on Dec. 3, 2021, now Pat. No. 11,997,833.

(Continued)

(51) Int. Cl.
*H05K 7/20* (2006.01)

(52) U.S. Cl.
CPC ..... *H05K 7/20836* (2013.01); *H05K 7/20754* (2013.01)

(58) Field of Classification Search
CPC .................................................. H05K 7/20836
See application file for complete search history.

(56) References Cited

U.S. PATENT DOCUMENTS

| | | | |
|---|---|---|---|
| 6,374,627 B1 | 4/2002 | Schumacher et al. | |
| 6,574,104 B2 | 6/2003 | Patel et al. | |

(Continued)

FOREIGN PATENT DOCUMENTS

| | | |
|---|---|---|
| AU | 2010245857 A1 | 11/2011 |
| WO | 2006119248 A2 | 11/2006 |
| WO | 2016130453 A1 | 8/2016 |

OTHER PUBLICATIONS

Norouzi-Khangah et al, Performance assessment of cooling systems in data centers; Methodology and application of a new thermal metric, 2016, ScienceDirect, pp. 1-18 (Year: 2016).*

(Continued)

*Primary Examiner* — Suresh Suryawanshi
(74) *Attorney, Agent, or Firm* — Quinn IP Law

(57) ABSTRACT

Examples of the disclosure include a method comprising receiving information-technology-device information indicative of IT equipment and including information-technology-device-location information and temperature information; determining, based on the information-technology-device information, an IT-equipment-cooling assessment; receiving cooling-unit information indicative of air output by the IT equipment to the cooling units and/or provided by the cooling units to the IT equipment; determining, based on the cooling-unit information, a cooling-airflow-return effectiveness indicative of how effectively the cooling units capture air output by the IT equipment and/or a cooling-airflow-supply effectiveness indicative of how effectively the cooling units provide air to the IT equipment; and displaying a simulation display depicting the IT equipment, an effectiveness indicator for the cooling-airflow-return effectiveness and/or the cooling-airflow-supply effectiveness, and a respective IT indicator for each IT-equipment-cooling assessment, wherein each respective IT indicator is (Continued)

displayed in association with a respective unit of IT equipment to which the respective IT indicator corresponds.

20 Claims, 18 Drawing Sheets

Related U.S. Application Data

(60) Provisional application No. 63/386,222, filed on Dec. 6, 2022, provisional application No. 63/121,275, filed on Dec. 4, 2020.

(56) References Cited

U.S. PATENT DOCUMENTS

| | | | | |
|---|---|---|---|---|
| 6,718,277 | B2 | 4/2004 | Sharma | |
| 8,639,482 | B2 | 1/2014 | Rasmussen et al. | |
| 8,712,735 | B2 | 4/2014 | VanGilder et al. | |
| 8,725,307 | B2 | 5/2014 | Healey et al. | |
| 8,972,217 | B2 | 3/2015 | VanGilder et al. | |
| 9,418,179 | B2 | 8/2016 | Zhang et al. | |
| 9,494,985 | B2 | 11/2016 | Rasmussen et al. | |
| 10,157,245 | B2 | 12/2018 | VanGilder et al. | |
| 10,210,288 | B2 | 2/2019 | Healey et al. | |
| 2005/0267639 | A1 | 12/2005 | Sharma et al. | |
| 2006/0121421 | A1 | 6/2006 | Spitaels et al. | |
| 2007/0038414 | A1 | 2/2007 | Rasmussen et al. | |
| 2008/0041076 | A1 | 2/2008 | Tutunoglu et al. | |
| 2008/0174954 | A1 | 7/2008 | VanGilder et al. | |
| 2009/0138313 | A1 | 5/2009 | Morgan et al. | |
| 2009/0207564 | A1 | 8/2009 | Campbell et al. | |
| 2010/0131109 | A1* | 5/2010 | Rasmussen | H05K 7/20836 700/277 |
| 2012/0158375 | A1 | 6/2012 | Healey | |
| 2012/0158387 | A1 | 6/2012 | VanGilder et al. | |
| 2014/0316720 | A1* | 10/2014 | Dumontier | G01F 1/00 702/45 |
| 2014/0358471 | A1 | 12/2014 | VanGilder et al. | |
| 2015/0331977 | A1 | 11/2015 | Healey et al. | |
| 2016/0234972 | A1* | 8/2016 | Billet | H05K 7/20836 |
| 2016/0249487 | A1* | 8/2016 | Bhagwat | H05K 7/20836 |
| 2019/0155268 | A1 | 5/2019 | Cohen et al. | |
| 2019/0187764 | A1* | 6/2019 | VanGilder | G06F 30/13 |
| 2022/0151109 | A1* | 5/2022 | VanGilder | H05K 7/20145 |
| 2022/0183191 | A1 | 6/2022 | VanGilder et al. | |

OTHER PUBLICATIONS

Extended European Search Report from corresponding European Application No. 23214432.9 dated May 7, 2024.

Bash, Cullen E. et al., "Efficient Thermal Management of Data Centers—Immediate and Long-Term Research Needs," vol. 9, No. 2, HVAC&R Research, Apr. 2003, pp. 1-16.

Extended European Search Report from corresponding European Application No. 21212322.8 dated Apr. 29, 2022.

Herrlin, Magnus K., Rack Cooling Effectiveness in Data Centers and Telecom Central Offices: The Rack Cooling Index (RCI)TM, DE-05-11-2, 2005, American Society of Heating, Refrigerating and Air-Conditioning Engineers, Inc. Reprinted by permission from ASHRAE Transactions, vol. 111, Part 2, pp. 1-11.

Vangilder, James et al., "A Compact Rack Model for Data Center CFD Modeling," 19th IEEE ITHERM Conference, 2020 IEEE, pp. 350-356.

Vangilder, James W. et al., "Capture Index: An Airflow-Based Rack Cooling Performance Metric," 2007, American Society of Heating, Refrigerating and Air-Conditioning Engineers, Inc. [www.ashrae.org), Published in ASHRAE Transactions 2007, vol. 113, Part 1, DA-07-014, pp. 126-136.

Vangilder, Jim et al., "IT Equipment Cooling Assessment and Metrics," 21st IEEE ITHERM Conference, 2022 IEEE, pp. 540-545.

* cited by examiner b) Hot-aisle capture index (HACI)

a) Cold-aisle capture index (CACI)

b) Cooling Performance Assessment with Velocity Vectors a) Cooling Performance Assessment

SYSTEMS AND METHODS FOR ASSESSING COOLING PERFORMANCE IN A SPACE CONTAINING ONE OR MORE INFORMATION TECHNOLOGY (IT) EQUIPEMENTS AND ONE OR MORE COOLING UNITS

CROSS-REFERENCE TO RELATED APPLICATIONS

This application is a continuation-in-part of and claims priority to U.S. application Ser. No. 17/457,468, titled "IT-ROOM-COOLING-PERFORMANCE ASSESSMENT," filed Dec. 3, 2021, which claims priority under 35 U.S.C. § 119(e) to U.S. Provisional Application Ser. No. 63/121,275, titled "IT-ROOM-COOLING-PERFORMANCE ASSESSMENT," filed on Dec. 4, 2020. This application also claims priority under 35 U.S.C. § 119(e) to U.S. Provisional Application Ser. No. 63/386,222, titled "IT-ROOM-COOLING-PERFORMANCE ASSESSMENT," filed on Dec. 6, 2022. Each application referenced above is hereby incorporated by reference in its entirety.

BACKGROUND

1. Field of the Disclosure

At least one example in accordance with the present disclosure relates generally to cooling-performance assessments.

2. Discussion of Related Art

Power devices, such as uninterruptible power supplies (UPSs), may be used to provide regulated, uninterrupted power for sensitive and/or critical loads, such as computer servers. Several computer servers may be housed in a common location, such as a data center. Data centers may include cooling devices to manage heat output by the computer servers.

SUMMARY

At least one example in accordance with the present disclosure relates generally to information-technology-room cooling. Data centers often include computer servers and power-supply devices to provide power to the servers. Computer servers and power-supply devices generate heat when operating. Consequently, many data centers include cooling devices to cool the computer servers and/or power-supply devices. The cooling devices may regulate a temperature in the data center such that a temperature of the computer servers and/or power-supply devices is controllable.

According to at least one aspect of the present disclosure, an information-technology-design system is provided comprising at least one processor coupled to at least one memory, wherein the at least one processor is configured to receive information-technology-device information indicative of a plurality of information-technology devices in a space, the information-technology-device information including information-technology-device-location information, temperature information, and capture-index information, determine, based on the information-technology-device information, a containment type of the plurality of information-technology devices, select, based on the containment type, at least a portion of the capture-index information, determine, based on the information-technology-device-location information, the temperature information, and the at least the portion of the capture-index information, a respective cooling-performance assessment for each information-technology device of the plurality of information-technology devices, and display an indicator of the respective cooling-performance assessment for each information-technology device of the plurality of information-technology devices in the space.

In some examples, the temperature information is indicative of an inlet temperature of air drawn by the plurality of information-technology devices. In various examples, the capture-index information includes at least one of a cold-aisle capture index (CACI) or a hot-aisle capture index (HACI). In at least one example, the CACI is indicative of a percentage of cooling airflow provided to a respective information-technology device by a cooling resource. In some examples, the HACI is indicative of a percentage of output airflow provided by a respective information-technology device to a cooling resource. In various examples, the containment type is one of an uncontained type, a hot-and-cold-aisle containment type, a hot-aisle containment type, or a cold-aisle containment type.

In at least one example, the capture-index information includes at least one of a cold-aisle capture index (CACI) or a hot-aisle capture index (HACI), and selecting the at least the portion of the capture-index information based on the containment type includes selecting at least one of the CACI or the HACI based on the containment type being the uncontained type, the hot-and-cold-aisle containment type, the hot-aisle containment type, or the cold-aisle containment type. In some examples, the at least one processor is configured to determine the cooling-performance assessment based on a greater of the CACI and the HACI responsive to determining that the containment type is the uncontained type. In various examples, the at least one processor is configured to determine the cooling-performance assessment based on a lesser of the CACI and the HACI responsive to determining that the containment type is the hot-and-cold-aisle containment type.

In at least one example, the at least one processor is configured to determine the cooling-performance assessment based on the HACI responsive to determining that the containment type is the hot-aisle containment type. In some examples, the at least one processor is configured to determine the cooling-performance assessment based on the CACI responsive to determining that the containment type is the cold-aisle containment type. In various examples, the at least one processor further is configured to display the respective indicator of the cooling-performance assessment for each respective information-technology device of the plurality of information-technology devices with a view of at least one of a simulated airflow or a temperature gradient in the space.

In at least one example, each respective indicator of the cooling-performance assessment includes a respective cooling-performance classification of each information-technology device of the plurality of information-technology devices, and the at least one processor is further configured to provide a view of the plurality of information-technology devices in the space and, for each information-technology device, a representation of a respective cooling-performance classification. In some examples, the at least one processor further is configured to output the cooling-performance assessment with a view of at least one of a simulated airflow or a temperature gradient in the space with the representation of the respective cooling-performance classification for each information-technology device.

According to at least one aspect of the disclosure, a non-transitory computer-readable medium storing thereon sequences of computer-executable instructions for assessing a space containing a plurality of information-technology devices is provided, the sequences of computer-executable instructions including instructions that instruct at least one processor to receive information-technology-device information indicative of the plurality of information-technology devices in the space, the information-technology-device information including information-technology-device-location information, temperature information, and capture-index information, determine, based on the information-technology-device information, a containment type of the plurality of information-technology devices, select, based on the containment type, at least a portion of the capture-index information, determine, based on the information-technology-device-location information, the temperature information, and the at least the portion of the capture-index information, a respective cooling-performance assessment for each information-technology device of the plurality of information-technology devices in the space, and display an indicator of the respective cooling-performance assessment for each information-technology device of the plurality of information-technology devices in the space.

In some examples, the capture-index information includes at least one of a cold-aisle capture index (CACI) or a hot-aisle capture index (HACI), and selecting the at least the portion of the capture-index information based on the containment type includes selecting at least one of the HACI or the CACI. In various examples, the instructions further instruct the at least one processor to determine the cooling-performance assessment based on a greater of the CACI and the HACI responsive to determining that the containment type is an uncontained type. In at least one example, the instructions further instruct the at least one processor to determine the cooling-performance assessment based on a lesser of the CACI and the HACI responsive to determining that the containment type is a hot-and-cold-aisle containment type. In some examples, the instructions further instruct the at least one processor to determine the cooling-performance assessment based on the HACI responsive to determining that the containment type is a hot-aisle containment type, and determine the cooling-performance assessment based on the CACI responsive to determining that the containment type is a cold-aisle containment type.

According to at least one aspect of the disclosure, a method for assessing a space containing a plurality of information-technology devices is provided, the method comprising receiving information-technology-device information indicative of the plurality of information-technology devices in the space, the information-technology-device information including information-technology-device-location information, temperature information, and capture-index information, determining, based on the information-technology-device information, a containment type of the plurality of information-technology devices, selecting, based on the containment type, at least a portion of the capture-index information, determining, based on the information-technology-device-location information, the temperature information, and the at least the portion of the capture-index information, a respective cooling-performance assessment for each information-technology device of the plurality of information-technology devices in the space, and displaying an indicator of the respective cooling-performance assessment for each information-technology device of the plurality of information-technology devices in the space.

At least one example in accordance with the present disclosure relates generally to cooling-performance assessments and, in some examples, information technology (IT)-room-cooling-performance assessments. An IT room may include any space including IT equipment, such as a data center, a space containing uninterruptible power supplies (UPSs), or other spaces containing IT equipment. An IT room may include one or more computing components. It may be desirable to control a temperature in an IT room. For example, it may be desirable to provide cooling equipment in an IT room.

According to at least one aspect of the present disclosure, a system is provided comprising at least one processor coupled to at least one memory, wherein the at least one processor is configured to receive object information indicative of physical objects in a space, the object information including object-location information and at least one of temperature information or capture-index information, determine, based on the object information, at least one of a temperature assessment or a capture-index assessment, and determine, based on the at least one of the temperature assessment or the capture-index assessment, a cooling-performance assessment of the space. In at least one example, the at least one processor further is configured to display the cooling performance assessment with a view of the racks in a simulated IT room on a graphic-user interface showing at least one of a simulated airflow or temperature gradient through the simulated IT room.

According to at least one aspect of the disclosure, an IT-equipment-cooling design system is provided comprising at least one processor coupled to at least one memory, wherein the at least one processor is configured to receive physical-object data indicating physical objects in a simulated IT room, wherein the physical-object data comprises object-location data, object-size data, equipment-load data, and rack data, receive containment-intent rules, apply the containment-intent rules to the physical-object data to determine a containment intent of the simulated IT room, wherein the containment intent is at least one of hot-aisle containment or cold-aisle containment, determine an inlet-temperature metric for racks associated with the rack data, determine at least one of a cold-aisle-capture metric or a hot-aisle-capture metric for the racks, determine a composite-rack metric of the racks based on the inlet-temperature metric and the at least one of the cold-aisle-capture metric or the hot-aisle-capture metric, and display the composite-rack metric in association with a view of the racks in a view of the simulated IT room in a graphic-user interface showing at least one of a simulated airflow or temperature gradient through the simulated IT room.

According to some aspects of the disclosure, a non-transitory computer-readable medium storing thereon sequences of computer-executable instructions for assessing cooling in a space containing one or more units of IT equipment and one or more cooling units is provided, the sequences of computer-executable instructions including instructions that instruct at least one processor to receive information-technology-device information indicative of the one or more units of IT equipment, the information-technology-device information including information-technology-device-location information and temperature information, determine, for each unit of IT equipment of the one or more units of IT equipment based on the information-technology-device information, an IT-equipment-cooling assessment, receive cooling-unit information indicative of at least one of air output by the one or more units of IT equipment to the one or more cooling units or air provided by the one or more cooling units to the one or more units of IT equipment, determine, based on the cooling-unit information, at least one of a cooling-airflow-return effectiveness or a cooling-airflow-supply effectiveness, the cooling-airflow-return effectiveness being indicative of how effectively the one or more cooling units capture air output by the one or more units of IT equipment and the cooling-airflow-supply effectiveness being indicative of how effectively the one or more cooling units provide air to the one or more units of IT equipment, determine, based on the IT-equipment-cooling assessment for each unit of IT equipment and based on the at least one of the cooling-airflow-return effectiveness or the cooling-airflow-supply effectiveness, a cooling-effectiveness metric for the space, and display, via a user interface, an indicator of the cooling-effectiveness metric for the space.

In some examples, the cooling-airflow-return effectiveness is indicative of a percentage of air output by the one or more units of IT equipment that is directly captured by the one or more cooling units. In various examples, being directly captured by the one or more cooling units includes the air output by the one or more units of IT equipment being captured by the one or more cooling units without first passing through other devices capable of changing a temperature of the air. In at least one example, the cooling-airflow-supply effectiveness is indicative of a percentage of air that is supplied by the one or more cooling units directly to the one or more units of IT equipment.

In some examples, being directly supplied to the one or more cooling units includes the air output by the one or more cooling units being provided to the one or more units of IT equipment without first passing through other devices capable of changing a temperature of the air. In various examples, the cooling-effectiveness metric is determined based on the cooling-airflow-return effectiveness and the cooling-airflow-supply effectiveness. In at least one example, the cooling-effectiveness metric is determined based on a worst metric of the IT-equipment-cooling assessment for each unit of IT equipment and the at least one of the cooling-airflow-return effectiveness or the cooling-airflow-supply effectiveness.

According to at least one aspect of the disclosure, a method of assessing cooling in a space containing one or more units of IT equipment and one or more cooling units is provided, the method comprising receiving information-technology-device information indicative of a plurality of information-technology devices in a space, the information-technology-device information including information-technology-device-location information and temperature information, determining, for each unit of IT equipment of the one or more units of IT equipment based on the information-technology-device information, an IT-equipment-cooling assessment, receiving cooling-unit information indicative of at least one of air output by the one or more units of IT equipment to the one or more cooling units or air provided by the one or more cooling units to the one or more units of IT equipment, determining, based on the cooling-unit information, at least one of a cooling-airflow-return effectiveness or a cooling-airflow-supply effectiveness, the cooling-airflow-return effectiveness being indicative of how effectively the one or more cooling units capture air output by the one or more units of IT equipment and the cooling-airflow-supply effectiveness being indicative of how effectively the one or more cooling units provide air to the one or more units of IT equipment, determining, based on the IT-equipment-cooling assessment for each unit of IT equipment and based on the at least one of the cooling-airflow-return effectiveness or the cooling-airflow-supply effectiveness, a cooling-effectiveness metric for the space, and displaying, via a user interface, an indicator of the cooling-effectiveness metric for the space.

In some examples, the cooling-airflow-return effectiveness is indicative of a percentage of air output by the one or more units of IT equipment that is directly captured by the one or more cooling units. In various examples, being directly captured by the one or more cooling units includes the air output by the one or more units of IT equipment being captured by the one or more cooling units without first passing through other devices capable of changing a temperature of the air. In at least one example, the cooling-airflow-supply effectiveness is indicative of a percentage of air that is supplied by the one or more cooling units directly to the one or more units of IT equipment.

In some examples, being directly supplied to the one or more cooling units includes the air output by the one or more cooling units being provided to the one or more units of IT equipment without first passing through other devices capable of changing a temperature of the air. In various examples, the cooling-effectiveness metric is determined based on the cooling-airflow-return effectiveness and the cooling-airflow-supply effectiveness. In at least one example, the cooling-effectiveness metric is determined based on a worst metric of the IT-equipment-cooling assessment for each unit of IT equipment and the at least one of the cooling-airflow-return effectiveness or the cooling-airflow-supply effectiveness.

According to at least one example of the disclosure, a system is provided comprising one or more units of IT equipment in a space, one or more cooling units in the space, and at least one processor configured to receive information-technology-device information indicative of the one or more units of IT equipment, the information-technology-device information including information-technology-device-location information and temperature information, determine, for each unit of IT equipment of the one or more units of IT equipment based on the information-technology-device information, an IT-equipment-cooling assessment, receive cooling-unit information indicative of at least one of air output by the one or more units of IT equipment to the one or more cooling units or air provided by the one or more cooling units to the one or more units of IT equipment, determine, based on the cooling-unit information, at least one of a cooling-airflow-return effectiveness or a cooling-airflow-supply effectiveness, the cooling-airflow-return effectiveness being indicative of how effectively the one or more cooling units capture air output by the one or more units of IT equipment and the cooling-airflow-supply effectiveness being indicative of how effectively the one or more cooling units provide air to the one or more units of IT equipment, determine, based on the IT-equipment-cooling assessment for each unit of IT equipment and based on the at least one of the cooling-airflow-return effectiveness or the cooling-airflow-supply effectiveness, a cooling-effectiveness metric for the space, and display, via a user interface, an indicator of the cooling-effectiveness metric for the space.

In some examples, the cooling-airflow-return effectiveness is indicative of a percentage of air output by the one or more units of IT equipment that is directly captured by the one or more cooling units. In various examples, being directly captured by the one or more cooling units includes the air output by the one or more units of IT equipment being captured by the one or more cooling units without first passing through other devices capable of changing a temperature of the air. In at least one example, the cooling-airflow-supply effectiveness is indicative of a percentage of air that is supplied by the one or more cooling units directly to the one or more units of IT equipment.

In some examples, being directly supplied to the one or more cooling units includes the air output by the one or more cooling units being provided to the one or more units of IT equipment without first passing through other devices capable of changing a temperature of the air. In various examples, the cooling-effectiveness metric is determined based on the cooling-airflow-return effectiveness and the cooling-airflow-supply effectiveness. In at least one example, the cooling-effectiveness metric is determined based on a worst metric of the IT-equipment-cooling assessment for each unit of IT equipment and the at least one of the cooling-airflow-return effectiveness or the cooling-airflow-supply effectiveness.

According to at least one aspect of the disclosure, a non-transitory computer-readable medium storing thereon sequences of computer-executable instructions for assessing cooling in a space containing one or more units of information technology (IT) equipment and one or more cooling units is provided, the sequences of computer-executable instructions including instructions that instruct at least one processor to receive information-technology-device information indicative of the one or more units of IT equipment, the information-technology-device information including information-technology-device-location information and temperature information; determine, for each unit of IT equipment of the one or more units of IT equipment based on the information-technology-device information, an IT-equipment-cooling assessment; receive cooling-unit information indicative of at least one of air output by the one or more units of IT equipment to the one or more cooling units or air provided by the one or more cooling units to the one or more units of IT equipment; determine, based on the cooling-unit information, at least one of a cooling-airflow-return effectiveness or a cooling-airflow-supply effectiveness, the cooling-airflow-return effectiveness being indicative of how effectively the one or more cooling units capture air output by the one or more units of IT equipment and the cooling-airflow-supply effectiveness being indicative of how effectively the one or more cooling units provide air to the one or more units of IT equipment; and display, via a user interface: a simulation display depicting the one or more units of IT equipment, an effectiveness indicator for the at least one of the cooling-airflow-return effectiveness or the cooling-airflow-supply effectiveness, and a respective IT indicator for each IT-equipment-cooling assessment, wherein each respective IT indicator is displayed in association with a respective unit of IT equipment to which the respective IT indicator corresponds.

In at least one example, the cooling-airflow-return effectiveness is indicative of a percentage of air output by the one or more units of IT equipment that is directly captured by the one or more cooling units. In at least one example, being directly captured by the one or more cooling units includes the air output by the one or more units of IT equipment being captured by the one or more cooling units without first passing through other devices capable of changing a temperature of the air. In at least one example, the cooling-airflow-supply effectiveness is indicative of a percentage of air that is supplied by the one or more cooling units directly to the one or more units of IT equipment.

In at least one example, being directly supplied to the one or more cooling units includes the air output by the one or more cooling units being provided to the one or more units of IT equipment without first passing through other devices capable of changing a temperature of the air. In at least one example, determining the at least one of the cooling-airflow-return effectiveness or the cooling-airflow-supply effectiveness is based on every unit of IT equipment in the space. In at least one example, determining the at least one of the cooling-airflow-return effectiveness or the cooling-airflow-supply effectiveness includes weighting an airflow rate of each of the one or more units of IT equipment.

According to at least one example of the disclosure, a method of assessing cooling in a space containing one or more units of information technology (IT) equipment and one or more cooling units is provided, the method comprising receiving information-technology-device information indicative of the one or more units of IT equipment, the information-technology-device information including information-technology-device-location information and temperature information; determining, for each unit of IT equipment of the one or more units of IT equipment based on the information-technology-device information, an IT-equipment-cooling assessment; receiving cooling-unit information indicative of at least one of air output by the one or more units of IT equipment to the one or more cooling units or air provided by the one or more cooling units to the one or more units of IT equipment; determining, based on the cooling-unit information, at least one of a cooling-airflow-return effectiveness or a cooling-airflow-supply effectiveness, the cooling-airflow-return effectiveness being indicative of how effectively the one or more cooling units capture air output by the one or more units of IT equipment and the cooling-airflow-supply effectiveness being indicative of how effectively the one or more cooling units provide air to the one or more units of IT equipment; and displaying, via a user interface: a simulation display depicting the one or more units of IT equipment, an effectiveness indicator for the at least one of the cooling-airflow-return effectiveness or the cooling-airflow-supply effectiveness, and a respective IT indicator for each IT-equipment-cooling assessment, wherein each respective IT indicator is displayed in association with a respective unit of IT equipment to which the respective IT indicator corresponds.

In at least one example, the cooling-airflow-return effectiveness is indicative of a percentage of air output by the one or more units of IT equipment that is directly captured by the one or more cooling units. In at least one example, being directly captured by the one or more cooling units includes the air output by the one or more units of IT equipment being captured by the one or more cooling units without first passing through other devices capable of changing a temperature of the air. In at least one example, the cooling-airflow-supply effectiveness is indicative of a percentage of air that is supplied by the one or more cooling units directly to the one or more units of IT equipment.

In at least one example, being directly supplied to the one or more cooling units includes the air output by the one or more cooling units being provided to the one or more units of IT equipment without first passing through other devices capable of changing a temperature of the air. In at least one example, determining the at least one of the cooling-airflow-return effectiveness or the cooling-airflow-supply effectiveness is based on every unit of IT equipment in the space. In at least one example, determining the at least one of the cooling-airflow-return effectiveness or the cooling-airflow-supply effectiveness includes weighting an airflow rate of each of the one or more units of IT equipment.

According to at least one example of the disclosure, a system is provided comprising: one or more units of information technology (IT) equipment in a space; one or more cooling units in the space; and at least one processor coupled to memory and/or storage and being configured to: receive information-technology-device information indicative of the one or more units of IT equipment, the information-technology-device information including information-technology-device-location information and temperature information; determine, for each unit of IT equipment of the one or more units of IT equipment based on the information-technology-device information, an IT-equipment-cooling assessment; receive cooling-unit information indicative of at least one of air output by the one or more units of IT equipment to the one or more cooling units or air provided by the one or more cooling units to the one or more units of IT equipment; determine, based on the cooling-unit information, at least one of a cooling-airflow-return effectiveness or a cooling-airflow-supply effectiveness, the cooling-airflow-return effectiveness being indicative of how effectively the one or more cooling units capture air output by the one or more units of IT equipment and the cooling-airflow-supply effectiveness being indicative of how effectively the one or more cooling units provide air to the one or more units of IT equipment; and display, via a user interface: a simulation display depicting the one or more units of IT equipment, an effectiveness indicator for the at least one of the cooling-airflow-return effectiveness or the cooling-airflow-supply effectiveness, and a respective IT indicator for each IT-equipment-cooling assessment, wherein each respective IT indicator is displayed in association with a respective unit of IT equipment to which the respective IT indicator corresponds.

In at least one example, the cooling-airflow-return effectiveness is indicative of a percentage of air output by the one or more units of IT equipment that is directly captured by the one or more cooling units. In at least one example, being directly captured by the one or more cooling units includes the air output by the one or more units of IT equipment being captured by the one or more cooling units without first passing through other devices capable of changing a temperature of the air. In at least one example, the cooling-airflow-supply effectiveness is indicative of a percentage of air that is supplied by the one or more cooling units directly to the one or more units of IT equipment. In at least one example, being directly supplied to the one or more cooling units includes the air output by the one or more cooling units being provided to the one or more units of IT equipment without first passing through other devices capable of changing a temperature of the air. In at least one example, determining the at least one of the cooling-airflow-return effectiveness or the cooling-airflow-supply effectiveness is based on every unit of IT equipment in the space and includes weighting an airflow rate of every unit of IT equipment.

BRIEF DESCRIPTION OF THE DRAWINGS

Various aspects of at least one embodiment are discussed below with reference to the accompanying figures, which are not intended to be drawn to scale. The figures are included to provide an illustration and a further understanding of the various aspects and embodiments, and are incorporated in and constitute a part of this specification, but are not intended as a definition of the limits of any particular embodiment. The drawings, together with the remainder of the specification, serve to explain principles and operations of the described and claimed aspects and embodiments. In the figures, each identical or nearly identical component that is illustrated in various figures is represented by a like numeral. For purposes of clarity, not every component may be labeled in every figure. In the figures:

DETAILED DESCRIPTION

Figure 1B:
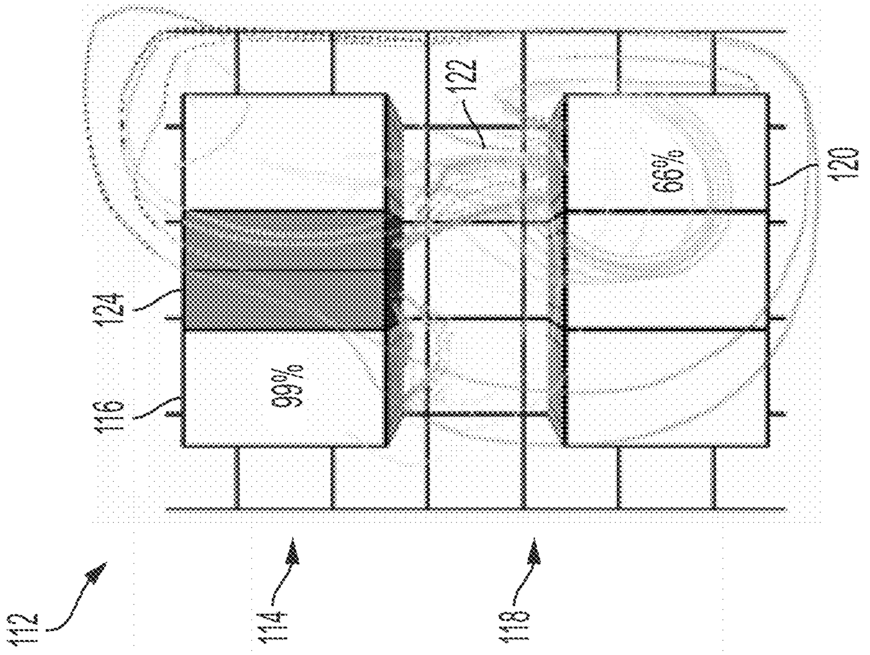
FIG. 1B illustrates a schematic diagram of a hot-aisle capture index displayed in a simulation according to an example.

Examples of the methods and systems discussed herein are not limited in application to the details of construction and the arrangement of components set forth in the following description or illustrated in the accompanying drawings. The methods and systems are capable of implementation in other embodiments and of being practiced or of being carried out in various ways. Examples of specific implementations are provided herein for illustrative purposes only and are not intended to be limiting. In particular, acts, components, elements and features discussed in connection with any one or more examples are not intended to be excluded from a similar role in any other examples.

Also, the phraseology and terminology used herein is for the purpose of description and should not be regarded as limiting. Any references to examples, embodiments, components, elements or acts of the systems and methods herein referred to in the singular may also embrace embodiments including a plurality, and any references in plural to any embodiment, component, element or act herein may also embrace embodiments including only a singularity. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items.

References to "or" may be construed as inclusive so that any terms described using "or" may indicate any of a single, more than one, and all of the described terms. In addition, in the event of inconsistent usages of terms between this document and documents incorporated herein by reference, the term usage in the incorporated features is supplementary to that of this document; for irreconcilable differences, the term usage in this document controls. Information-technology (IT) rooms include spaces designed to house one or more IT devices (also referred to as "IT equipment," or "units of IT equipment"). IT devices include computers, storage, memory, networking devices, power-supply devices, and other physical devices or infrastructure to enable creating, processing, storing, securing, and/or exchanging electronic information and data. A data center is an example of an IT room. As discussed above, data centers include IT devices such as servers and power-supply devices to power the servers. For example, a data center may include a rack, which is also an IT device, configured to house and facilitate interconnection between servers, power-supply devices, and/or additional IT devices. Data centers may include cooling devices (or "cooling resources"), such as heating, ventilation, and air conditioning (HVAC) devices, to cool the IT room and/or IT devices. The cooling resources themselves may also be considered IT devices.

Certain industry groups, such as the American Society of Heating, Refrigerating, and Air-Conditioning Engineers (ASHRAE), may provide guidelines as to data-center cooling metrics and targets. For example, IT-equipment inlet temperature is a data-center-cooling-performance metric specified by certain data-center-industry guidelines. Data-center racks, or equipment housed thereby, may include air intakes to receive intake air to cool the housed equipment, and air exhaust to expel exhaust air. IT-equipment inlet temperature may refer to a temperature of air received at the air intake.

Temperature is a simple and familiar metric, and may be feasibly measured or predicted for an existing facility. Some IT products report and store key system temperatures and IT manufacturers may consider inlet-temperature history for issues related to warranty service and replacement. Temperature may be considered a "symptom" of underlying airflow patterns—outside of and inside of a rack, for example—which may or may not behave as intended for the selected cooling architecture. Undesirable airflow patterns may make the IT room less robust with respect to changing IT populations or workload and compromise energy efficiency.

IT-room designers may therefore consider airflow patterns in designing an IT room. Some IT rooms use standard cooling architectures which may have specific "design intent" regarding the airflow patterns associated with the supply of cool air to IT inlets and the capturing of warm air from IT exhausts. For example, with a traditional raised-floor architecture, cooling airflow is intended to be supplied directly from perforated tiles to IT-equipment inlets. As another example, row-based cooling is intended to supply cooling airflow directly to the IT equipment and capture warm IT exhaust airflow directly from IT equipment. In some examples, a design intent may therefore refer to an intended "containment" of intake air or exhaust air.

A containment type may be one of several known airflow-containment schemes, such as hot-aisle containment, cold-aisle containment, hot-and-cold-aisle containment, or no containment (or "uncontained"). Such containment refers to the spatial containment of cold air supplied by cooling resources into one or more "cold aisles," and/or the spatial containment of hot exhaust air output by units of IT equipment into one or more "hot aisles," and are employed in industries such as data-center design. A design intent for a particular containment type may be determined based on an arrangement of IT equipment, such as by determining whether cooling resources are positioned relative to IT-equipment intakes in a manner that produces a cold aisle.

When cold- or hot-aisle containment is employed, the design intent (to supply cold air directly to IT inlets or capture warm air directly from IT exhausts, for example) may be relatively clear. In some architectures, the design intent is less clear or is simply to mix cool air into the entire whitespace volume. For example, when airflow is supplied around the perimeter of the room in a "flooded" rather than "targeted" manner. As discussed above, if it is not apparent that there is a design intent for any particular containment, a containment type may be determined to be "uncontained."

Computational fluid dynamics (CFD) software may be employed when designing a new IT room or assessing an existing IT room to visualize airflow patterns. Such CFD software may be used to evaluate whether a design intent is being effectively realized, for example, by providing parameter predictions (for example, predicted temperatures) and simulated visualizations (for example, a simulated visualization of airflow patterns). While CFD simulations may enable a user to predict IT-inlet temperatures, such simulations may also predict airflow patterns, temperatures, and pressures at all points throughout the facility as well as other derived quantities and metrics. Consequently, a CFD simulation may provide rich and detailed information more quickly and/or easily, in some examples, than can be practically measured in an actual facility.

However, time and expert knowledge are required to interpret such information. While CFD software may provide information such as airflow patterns that may aid a user in evaluating an IT-room design, the CFD software does not provide an assessment of the IT-room design. Rather, a user is left to interpret and assess the information. Moreover, because there are multiple types of capture indices and one, multiple, or none may apply depending on a specific cooling architecture, capture indices may not be considered by CFD software that cannot determine which, if any, capture indices are applicable. Existing solutions may therefore determine cooling efficacy based only on temperature values (for example, IT-inlet temperatures), rather than capture indices such as a hot-aisle capture index (HACI) and a cold-aisle capture index (CACI), which may yield inaccurate results by failing to include all available information in making an efficacy determination. CFD software for IT-room design thus not only requires extensive experience and training to interpret because no assessment is provided, but also may fail to property account for capture indices by either omitting the capture indices or selecting improper capture indices.

In light of the foregoing, certain examples of the disclosure provide a cooling-performance assessment for each IT device in an IT room, such as each rack in a data center. Each IT device may receive a cooling-performance-assessment classification in one of several possible states. In various examples, the number of possible states may include two states, three states, four states, or a different number of states. In one implementation a classification may be in one of a first state, a second state, or a third state based on the cooling-performance assessment. For example, the first state may be a "good" state, the second state may be a "marginal" state, and the third state may be a "bad" state. In another example, a classification may be in one of two states: a first state, which may be a "good" state, and a second state, which may be a "marginal" state. In still other examples, other numbers of states may be implemented, and these states may correspond to states other than and/or in addition to the "good," "marginal," and "bad" states. For purposes of example, examples discussed herein may use "good," "marginal," and/or "bad" states. A graphical user interface (GUI) may display a representation of the IT devices in the IT room overlaid with the classifications, and/or a graphical representation of each of the classifications (for example, a green checkmark representing a "good" classification, a yellow yield sign representing a "marginal" classification, and/or a red "X" mark representing a "bad" classification) for each of the IT devices.

In various examples, a cooling-effectiveness metric may be provided for a room as a whole in addition to, or in lieu of, providing a cooling-performance assessment for each IT device in a room of IT devices, such as a data center. The cooling-effectiveness metric may be part of an overall cooling-performance assessment for the data center, which may also include individual cooling-performance assessments for each IT device as discussed above. As used herein, a "cooling-effectiveness metric" may refer to an assessment of the cooling effectiveness for a group of one or more devices, such as IT devices. An "IT rack cooling check" may refer to an assessment of the cooling effectiveness for a single device in isolation, such as an IT rack. A "cooling-performance assessment" may refer to the cooling-effectiveness metric, the IT rack cooling check, or both.

In some examples, the cooling-effectiveness metric is calculated based on one or more parameters including at least one of IT rack cooling checks, a cooling-airflow-supply effectiveness, a cooling-airflow-return effectiveness, and/or a rack cooling metric. The cooling-airflow-supply effectiveness may be a parameter indicative of how effectively cooling air is directly supplied to IT racks. The cooling-airflow-return effectiveness may be a parameter indicative of how effectively hot air is directly captured from the IT racks. The rack cooling metric may be indicative of how effectively IT racks are cooled pursuant to industry standards (for example, ASHRAE standards). For example, the rack cooling metric may include a known metric such as the Rack Cooling Index (RCI)™ metric.

The cooling-performance assessment may additionally or alternatively (for example, depending on whether the cooling-performance assessment is indicative of the IT rack cooling check[s], the cooling-effectiveness metric, or both) be a function of inlet temperature, capture indices, and the specific data-center cooling architecture. At least by incorporating the captures indices and specific data-center cooling architecture in generating the cooling-performance assessment, more accurate information is provided in addition to an overall cooling-performance assessment rather than simply raw data or calculations. Moreover, information is displayed in an easily comprehensible format by displaying a GUI having representations of the IT devices in the IT room overlaid with representations of the cooling-performance-assessment classifications for each IT device. In some examples, the GUI may additionally display the cooling-effectiveness metric for the IT room as a whole, which may be determined based on, and/or displayed along with, the cooling-performance-assessments for each IT device, the cooling-airflow-return effectiveness, the cooling-airflow-supply effectiveness, and/or the rack cooling metric. It is to be appreciated that, although certain examples are provided with respect to data centers, examples of the disclosure are more broadly applicable to other architectures and IT rooms involving heating and/or cooling technologies.

Current IT-room-design systems may therefore fail to provide an accurate or easily comprehensible assessment of IT-room cooling performance. Such systems may operate inefficiently, because extensive training and expertise is required, and less than all available information may be properly utilized in evaluating an IT room. Moreover, such systems may simply provide raw data or calculations rather than one or more overall cooling-performance assessments, which requires that a human user perform a subjective review of the data and calculations. The raw data or calculations of existing systems may not be displayed via an easily comprehensible GUI and therefore may require additional time and expertise to interpret. This is a technical problem. An exemplary embodiment of an IT-room-design system includes one or more units of IT equipment in a space, one or more cooling units in the space, and at least one processor configured to receive information-technology-device information indicative of the one or more units of IT equipment, the information-technology-device information including information-technology-device-location information and temperature information, determine, for each unit of IT equipment of the one or more units of IT equipment based on the information-technology-device information, an IT-equipment-cooling assessment, receive cooling-unit information indicative of at least one of air output by the one or more units of IT equipment to the one or more cooling units or air provided by the one or more cooling units to the one or more units of IT equipment, determine, based on the cooling-unit information, at least one of a cooling-airflow-return effectiveness or a cooling-airflow-supply effectiveness, the cooling-airflow-return effectiveness being indicative of how effectively the one or more cooling units capture air output by the one or more units of IT equipment and the cooling-airflow-supply effectiveness being indicative of how effectively the one or more cooling units provide air to the one or more units of IT equipment, determine, based on the IT-equipment-cooling assessment for each unit of IT equipment and based on the at least one of the cooling-airflow-return effectiveness or the cooling-airflow-supply effectiveness, a cooling-effectiveness metric for the space, and display, via a user interface, an indicator of the cooling-effectiveness metric for the space. At least this foregoing combination of features comprises an IT-room-design system that serves as a technical solution to the foregoing technical problem. This technical solution is not routine and is unconventional. This technical solution is a practical application of the IT-room-design system that solves the foregoing technical problem and constitutes an improvement in the technical field of IT-room-design visualization at least by providing a more accurate cooling-performance assessment, additional information related to the cooling-performance assessment, and a more easily comprehensible cooling-performance-assessment display.

Examples of the disclosure include determining a cooling-performance assessment for an IT device based at least in part on a temperature, a location of the IT device, and one or more capture indices for the IT device. As discussed above, capture indices may include a CACI and/or a HACI. Using a rack in a data center as an example, a CACI may be defined as the percentage of a rack's intake cooling airflow supplied directly by local cooling resources such as perforated floor tiles or local cooling units. A HACI may be defined as the percentage of a rack's exhaust airflow which is directly captured by local cooling resources such as perforated ceiling tiles or local cooling units.

Figure 1A:
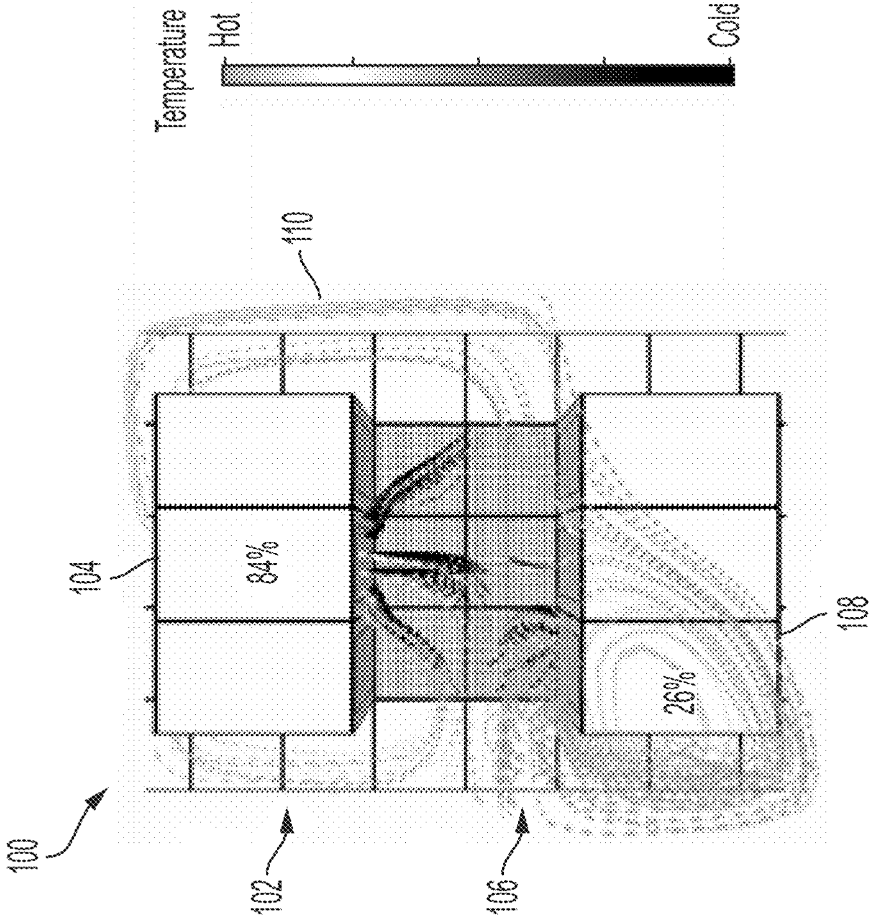
FIG. 1A illustrates a schematic diagram of a cold-aisle capture index displayed in a simulation according to an example.

FIG. 1A illustrates a schematic diagram of a CACI being used in a simulation display 100 according to an example. The simulation display 100 includes a first group of racks 102 having a first rack 104, and a second group of racks 106 having a second rack 108. The simulation display 100 also includes an airflow pattern 110 indicative of a simulated airflow. The simulation display 100 displays a first CACI of the first rack 104 ("84%") overlaid on the first rack 104, and a second CACI of the second rack 108 ("26%") overlaid on the second rack 108. The CACIs may be calculated by CFD software. For example, the CFD software may analyze an arrangement of IT devices, such as server racks, and calculate predicted CACIs based on the position of IT devices, cooling equipment, and so forth.

The first CACI indicates that 84% of intake air received by the first rack 104 is provided directly by a cooling resource. The second CACI indicates that 26% of the intake air received by the second rack 108 is provided directly by a cooling resource. As depicted by the airflow pattern 110, much of the intake air of the second rack 108 may be received from an exhaust of the first rack 104, thus at least partially explaining the relatively low value of the second CACI.

FIG. 1B illustrates a schematic diagram of a HACI being used in a simulation display 112 according to an example. The simulation display 112 includes a first group of racks 114 having a first rack 116, and a second group of racks 118 having a second rack 120. The simulation display 112 also includes an airflow pattern 122 indicative of a simulated airflow. The simulation display 112 displays a first HACI of the first rack 116 ("99%") overlaid on the first rack 116, and a second HACI of the second rack 120 ("66%") overlaid on the second rack 120. The HACIs may be calculated by CFD software. For example, the CFD software may analyze an arrangement of IT devices, such as server racks, and calculate predicted HACIs based on the position of IT devices, cooling equipment, and so forth.

The first HACI indicates that 99% of exhaust air output by the first rack 116 is provided directly to a cooling resource. The second HACI indicates that 66% of the exhaust air output by the second rack 120 is provided directly to a cooling resource. As depicted by the airflow pattern 122, much of the exhaust air output by the second rack 120 may be received at an intake of a third rack 124, thus at least partially explaining the relatively low value of the second HACI.

Accordingly, CACIs and HACIs may be determined based at least in part on a position, a number, and operating parameters of local cooling supplies and/or returns. The "design intent" of the cooling architecture may be incorporated into the capture-index calculation (for example, a calculation performed by CFD software) by rules that govern what is considered a "local" cooling supply or return. For example, when there are no obvious local cooling supplies or returns, neither the CACI nor HACI may be computed. In other examples, the CACIs and/or HACIs may be computed even when there are no obvious local cooling supplies or returns.

CFD software may determine whether or not to classify supplies and/or returns as local cooling supplies and/or returns. In one example for a standard raised-floor architecture, all perforated tiles located within a cold aisle adjacent to a rack may be considered local supplies. If the return airflow to the cooling units is via a dropped ceiling, all the perforated ceiling tiles over the corresponding adjacent hot aisle may be considered local returns in some examples. CFD software may incorporate rules to precisely define which equipment are part of specific cold- and hot-aisle groupings in some examples. Such rules may be adopted for other cooling architectures such as row-based cooling, for example. In various examples, local supplies and returns are those of the row-based cooling units which are considered members of the same cold- or hot-aisle grouping as a given rack. In some examples, combinations of cooling architectures are possible so that, for example, row-based-cooler supplies and perforated floor tiles may be considered "local supplies" associated with a given rack. The application of such rules may imply that a finite value returned for cold or hot aisle capture indices indicates the presence of local supplies or returns and, more generally in some examples, the design intent of the cooling architecture.

Capture indices may be indicative of airflow external to the rack and, in some examples, internal to the rack. Depending on the level of modeling detail included and the goals of the CFD simulation, airflow patterns internal to the rack may or may not be considered in determining capture indices. For example, a HACI calculation may track the IT-equipment exhaust through the rack (for example, passing through a perforated rear door or top leakage paths) into an IT room and, ultimately, into the return of local cooling equipment (or not, such as by flowing into an intake of other IT equipment). In some examples, internal and external captures indices may be determined as separate metrics. For example, an internal HACI may be determined based on IT exhaust to the rear or top of the rack and an external HACI may be determined based on IT exhaust from the rear or top of the rack through the IT room Similar principles apply to determining one or more CACIs. In another example, an overall capture index may be determined that either incorporates both internal and external metrics or that ignores one of the internal or external metrics.

For purposes of explanation, in various examples discussed herein internal and external capture indices may not be explicitly distinguished, and an overall capture index may instead be determined. In other examples, however, either or both of an external or internal capture index may be determined. For example, some CFD simulations may not provide any airflow information inside of the rack and only the external capture index is possible. In other cases, the internal capture indices may be easier to compute (for example, because rack internals may be idealized in some examples, whereas the external data-center environment may be variable and assumptions about definitions of "local cooling" may be included). Further, internal capture indices may be sufficient in cases where performance is limited by internal-rack airflow patterns (for example, when containment results in pressure variations which may drive internal airflows and re-circulations).

In various examples, a cooling-performance assessment may be determined for each unit of IT equipment. For example, in the context of a data center, a cooling-performance assessment may be determined for each rack in the data center. The cooling-performance assessment may classify each rack as having "good" cooling, "marginal" cooling, or "bad" cooling. The classification may be determined based on IT-inlet temperatures (that is, input-air temperatures) and capture indices (for example, CACIs and/or HACIs). In various examples, the IT-inlet temperatures and capture indices for each unit of IT equipment may also be classified as "good," "marginal," or "bad," and the cooling-performance assessment may be determined based on these classifications. In other examples, the cooling-performance assessment may be determined based on the IT-inlet temperatures and/or the capture indices directly, rather than being based on classifications thereof. Although in some examples a cooling-performance assessment may be determined for each rack, in other examples a cooling-performance assessment may be determined for units of IT equipment at a lower level of granularity, such as for each rack server, or at a higher level of granularity, such as for each row of racks.

A simulation may be displayed (for example, via a GUI) to illustrate the respective cooling-performance assessments of each unit of IT equipment. For example, FIG. 2A illustrates a schematic diagram of a simulation display 200 depicting cooling-performance assessments for each rack in a data center according to an example. The simulation display 200 includes depictions of several racks including a first rack 202, a second rack 204, and a third rack 206, and includes depictions of cooling units, each indicated at 208. A cooling-performance assessment may be determined for each of the racks 202-206 based at least in part on cooling provided by the cooling units 208. As discussed in greater detail below, a cooling-performance may be determined for each of the racks 202-206 automatically and, in some examples, may automatically select and use one or more capture indices in determining the cooling-performance assessments. The simulation display 200 may include a representation of each cooling-performance-assessment classification.

For example, the first rack 202 is displayed with a green check overlaid on the first rack 202. A green check may be an representation of a "good" classification of the first rack 202 in a cooling-performance assessment, indicating that the first rack 202 may be adequately cooled. The second rack 204 is displayed with a yellow triangle overlaid on the second rack 204. A yellow triangle may be an representation of a "marginal" classification of the second rack 204 in a cooling-performance assessment, indicating that minor opportunities exist for improving cooling of the second rack 204. The third rack 206 is displayed with a red "X" overlaid on the third rack 206. A red "X" may be a representation of a "bad" classification of the third rack 206 in a cooling-performance assessment, indicating that major opportunities exist for improving cooling of the third rack 206. It is to be appreciated a number and meaning of cooling-performance-assessment classifications, and the depictions thereof, may vary within the scope of the disclosure.

In various examples, a simulation display of cooling-performance assessments may be displayed along with any other CFD-predicted quantities including temperature values, temperature maps, pressure, airflow animations, and so forth. Such CFD-predicted quantities may be displayed numerically, graphically, a combination of both, and so forth.

Furthermore, although certain representations of cooling-performance classifications (for example, a "green check-mark" representation of a "good" classification, a "yellow yield sign" representation of a "marginal" classification, and/or a "red 'X' mark" representation of a "bad" classification) are illustrated for purposes of example, it is to be appreciated that alternate representations and/or corresponding classifications are within the scope of the disclosure.

Figure 2B:
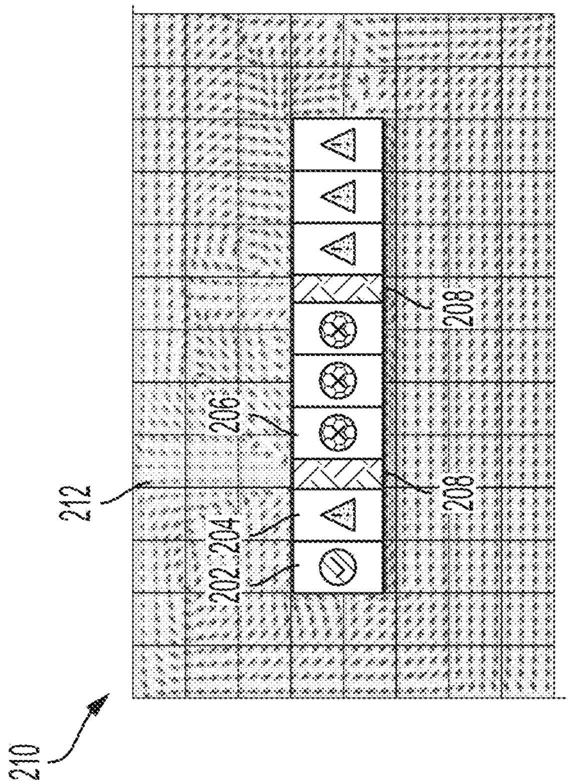
FIG. 2B illustrates a top-down schematic diagram of cooling-performance assessments of IT equipment and airflow-velocity vectors in a simulation according to an example.
Figure 2A:
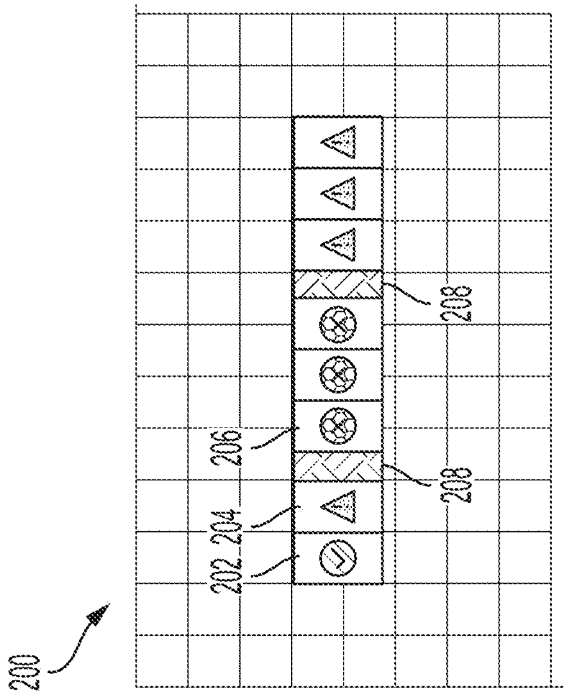
FIG. 2A illustrates a top-down schematic diagram of cooling-performance assessments of IT equipment in a simulation according to an example.

For example, FIG. 2B illustrates a schematic diagram of a simulation display 210 depicting cooling-performance assessments for each rack in a data center in combination with airflow velocity vectors according to an example. The simulation display 210 is substantially similar to the simulation display 200, and like aspects are labeled accordingly. The simulation display 210 further includes airflow velocity vectors 212 indicating a speed and direction of simulated airflow in an environment around the racks 202-206 and cooling units 208. The airflow velocity vectors 212 may provide additional context to a viewer viewing the simulation display 210. For example, a viewer may be able to visualize and diagnose a cause of each cooling-performance assessment using the airflow velocity vectors 212 and, if desired, make design modifications as needed to improve the cooling-performance assessments.

Figure 2C:
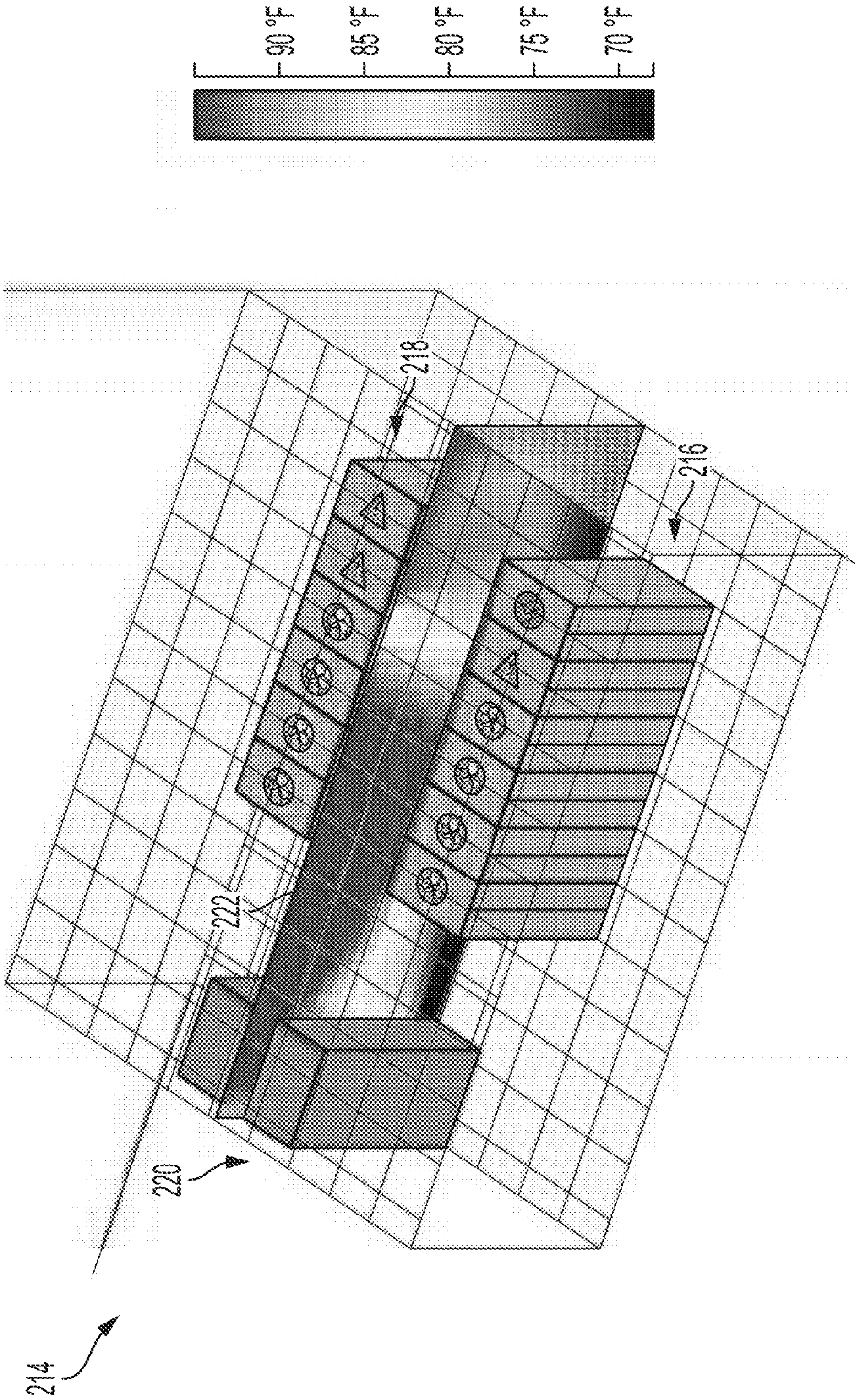
FIG. 2C illustrates a perspective schematic diagram of cooling-performance assessments of IT equipment and a temperature map in a simulation according to an example.

In another example, FIG. 2C illustrates a schematic diagram of a simulation display 214 depicting cooling-performance assessments for each rack in a data center in combination with a temperature map according to an example. The simulation display 214 is similar to the simulation displays 200, 210, albeit with a different IT-equipment configuration. For example, the simulation display 214 includes an indication of a first group of racks 216, an indication of a second group of racks 218, and an indication of cooling resources 220. Each rack of the groups of racks 216, 218 is displayed with a cooling-performance assessment overlaid thereon. Furthermore, the simulation display 214 includes a temperature map 222. The temperature map 222 provides a color-coded representation of a local temperature and additional context to a viewer viewing the simulation display 214. For example, a viewer may be able to visualize and diagnose a cause of each cooling-performance assessment using the temperature map 222 and, if desired, make design modifications as needed to improve the cooling-performance assessments.

Figure 3:
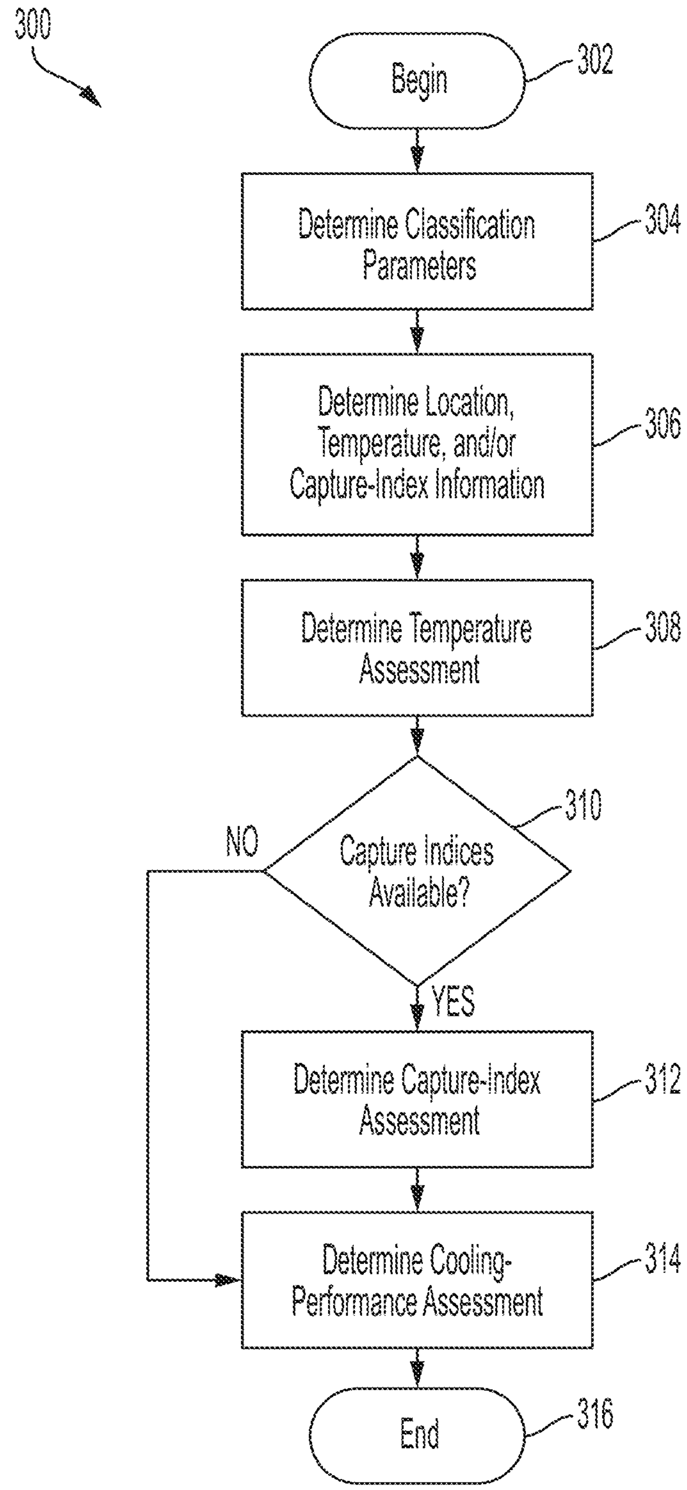
FIG. 3 illustrates a process of determining a cooling-performance assessment for one or more information-technology devices according to an example.

FIG. 3 illustrates a process 300 of determining a cooling-performance assessment for one or more units of IT equipment according to an example. The process 300 may be executed in connection with, or as part of, CFD software. A computing device, which may be local to or remote from an IT room containing the analyzed IT equipment, may execute the process 300 to aid a user in designing or analyzing the IT room. The process 300 may be executed for each respective unit of IT equipment. In one example, each unit of IT equipment is a data-center rack.

At act 302, the process 300 begins.

At act 304, classification parameters are determined. A cooling-performance assessment may be determined based on a temperature classification (or "temperature assessment") and/or a capture-index classification (or "capture-index assessment"). A temperature classification may be determined by determining an IT-inlet-temperature value and classifying the IT-inlet temperature into one of several categories, such as "good," "marginal," or "bad." Similarly, a capture-index classification may be determined by determining one or more capture indices and classifying the one or more capture indices into one of several categories, such as "good," "marginal," or "bad." Classification parameters are used to classify received IT-inlet-temperature values and/or capture-index values within a respective classification, such as "good," "marginal," or "bad." It is to be appreciated that although three example classifications are provided, in other examples, a different type and/or number of classifications may be provided, and that a type and/or number of classifications for temperature may different from those for capture indices.

Figure 4:
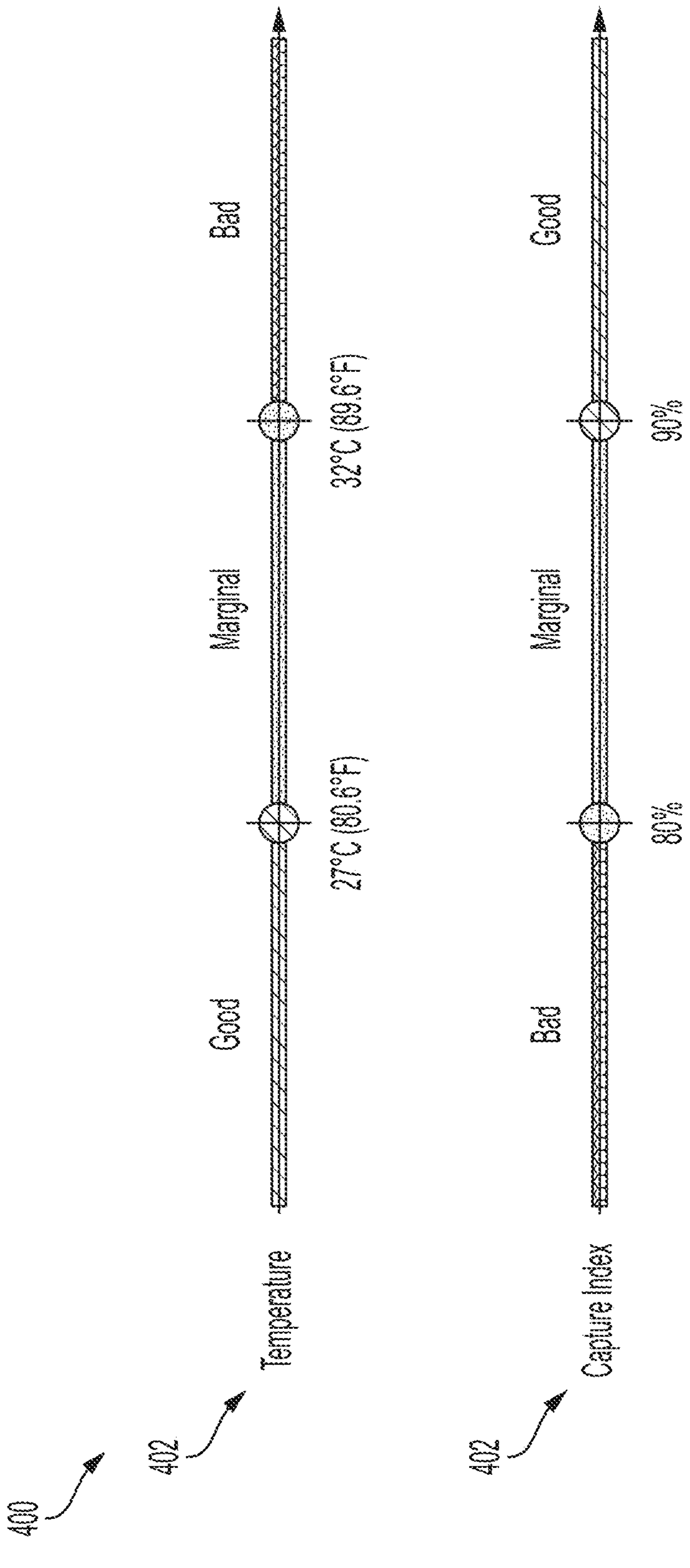
FIG. 4 illustrates a graph of classifications of temperatures and capture indices according to an example.

FIG. 4 illustrates a graph 400 of temperature- and capture-index-classification parameters according to an example. The temperature-classification parameters are illustrated by a temperature-classification scale 402 and the capture-index-classification parameters are illustrated by a capture-index-classification scale 404. As illustrated by the temperature-classification scale 402, an IT-inlet-temperature value of greater than 32° C. may be classified as "bad," an IT-inlet-temperature value of 32° C. or less but greater than 27° C. may be classified as "marginal," and an IT-inlet-temperature value of 27° C. or less may be classified as "bad." Similarly, as illustrated by the capture-index-classification scale 304, a capture index of 90% or greater may be classified as "good," a capture index of greater than 80% but less than 90% may be classified as "marginal," and a capture index of 80% or less may be classified as "bad." In various examples, the classification parameters used to classify temperature and/or capture indices may be based on industry guidelines, such as ASHRAE guidelines. It is to be appreciated, however, that other ranges and values are within the scope of the disclosure, and that the depicted classification parameters are provided for purposes of example only.

At act 306, temperature information, capture-index information, and/or information-technology-device-location information (or "location information") are determined. The temperature information, capture-index information, and location information may collectively be referred to as "information-technology-device information." The information-technology-device information may be received from storage or an external device, and/or calculated by the CFD software, and may be measured, calculated, and/or simulated. For example, CFD software may access certain device parameters (such as server power, for example, which can be used to determine a predicted heat output) which can be used to predict relevant parameters of an IT room and/or IT equipment. The temperature information includes temperature values, such as IT-inlet-temperature values indicative of a temperature of air drawn into an airflow intake of each unit of IT equipment. The capture-index information includes a HACI and/or CACI for each unit of IT equipment. The location information includes information indicative of a position, orientation, and/or size of each IT device in an IT room, such as each rack and/or cooling resource in a data center. In some examples, the location information further includes, or may be used to determine, containment information. Containment information may include a containment type of each unit of IT equipment.

In one example, a containment type is one of several known airflow-containment schemes, such as hot-aisle containment, cold-aisle containment, hot-and-cold-aisle containment, or no containment (or "uncontained"). As discussed above, such "containment" may refer to the spatial containment of cold air supplied by cooling resources into one or more "cold aisles," and/or the spatial containment of hot exhaust air output by units of IT equipment into one or more "hot aisles," and may be employed in industries such as data-center design. In one example, the containment information includes the containment type. In another example, the location information may be used to determine the containment type. For example, the location information may include a location and properties of (for example, power, cooling capacity, and so forth) one or more racks and one or more cooling resources, such that a containment type may be determined therefrom. Accordingly, act 306 includes receiving, for each unit of IT equipment, respective temperature information, capture-index information, and location information.

At act 308, a temperature assessment is determined. As discussed above, the classification parameters determined at act 304 may be used to classify, for each unit of IT equipment, the temperature information received at act 306 into one of several categories. For example, if the temperature information received at act 306 indicates, for a certain unit of IT equipment, a temperature value of 33° C., then in accordance with the example classification parameters of FIG. 4 a temperature assessment for the unit of IT equipment is "bad."

At act 310, a determination is made as to whether capture indices are available. Capture indices may include one or both a HACI and a CACI. Capture-index information, which may be received at act 306 in some examples, may include or be used to determine a HACI and/or a CACI. As discussed above, because capture indices may be determined based on an IT-room design intent, capture-index information may not be received, or may not be sufficient to determine a HACI and/or a CACI, at act 306 where a design intent is unclear, for example. If capture indices are available (310 YES), the process 300 continues to act 312. Otherwise, if capture indices are not available (310 NO), then the process 300 continues to act 314.

At act 312, a capture-index assessment is determined responsive to determining that one or more capture indices are available. As discussed above, the classification parameters determined at act 304 may be used to classify, for each unit of IT equipment, the capture-index information received at act 306 into one of several categories. For example, if the capture-index information received at act 306 indicates, for a certain unit of IT equipment, a capture index of 95%, then in accordance with the example classification parameters of FIG. 4 a capture-index assessment for the unit of IT equipment is "good."

Figure 5:
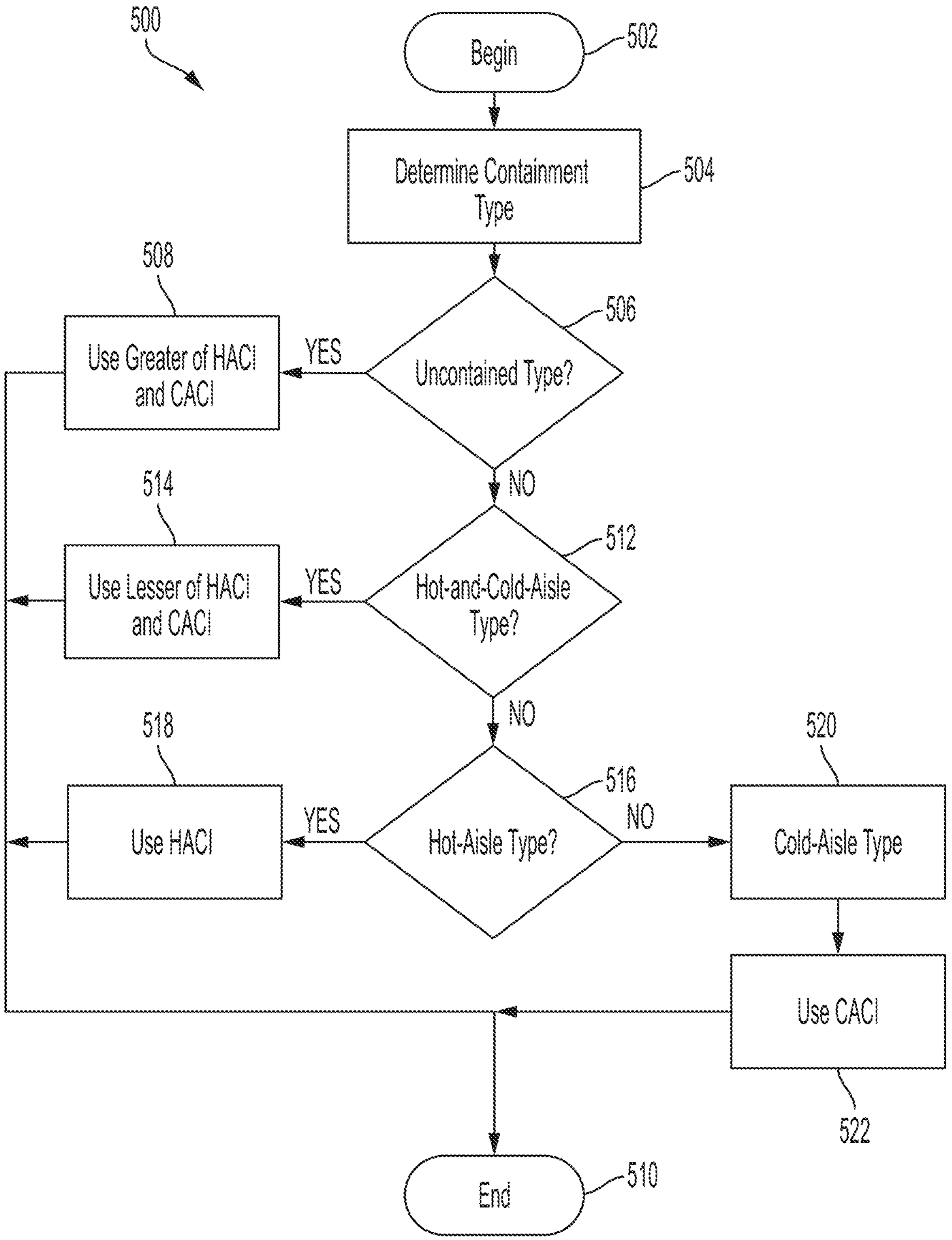
FIG. 5 illustrates a process of selecting a capture index for use in determining a cooling-performance assessment according to an example.

Act 312 may include selecting only a portion of the capture-index information to determine a capture-index assessment. For example, although both a HACI and a CACI may be available from the capture-index information, act 312 may include selecting only one of the HACI or the CACI to determine the capture-index assessment. One of the HACI or the CACI may be selected for determining the capture-index assessment based on the containment type indicated by the location information received at act 306. Table 1 indicates which capture index is used to determine a cooling-performance assessment based on a containment type according to one example. FIG. 5, discussed in greater detail below, illustrates a manner of selecting a capture index (that is, selecting a portion of the capture-index information) for use in determining a cooling-performance assessment where multiple capture indices (for example, a HACI and a CACI) are available in greater detail. If only one capture index is available, that capture index may be used at act 312 rather than executing the process of FIG. 5, in some examples.

TABLE 1

| Capture Index Assessment Metric | |
|---|---|
| Containment Type | Capture Index to Use |
| Uncontained Type | Maximum of CACI and HACI |
| Cold-Aisle Type | CACI |
| Hot-Aisle Type | HACI |
| Cold-and-Hot-Aisle Type | Minimum of CACI and HACI |

At act 314, a cooling-performance assessment is determined based on a temperature assessment determined at act 308 and, in some examples, a capture-index assessment determined at act 312. In examples in which a cooling-performance assessment is determined based only on a temperature assessment (for example, where the process 300 continues from act 310 directly to act 314 [310 NO]), the cooling-performance assessment may be set equal to the temperature assessment. For example, for a unit of IT equipment having a "bad" temperature assessment, the cooling-performance assessment may be determined at act 314 to be "bad."

Conversely, in examples in which a cooling-performance assessment is determined based on a capture-index assessment in addition to a temperature assessment, the same or different weights may be given to the temperature assessment and the capture-index assessment in determining the cooling-performance assessment. For example, a temperature assessment may be given more weight than a capture-index assessment in one example. It is to be appreciated that a "bad" capture index may not indicate that IT equipment will be immediately compromised. For example, if an IT-inlet temperature is classified as "good" despite capture indices being classified as "bad," IT equipment may operate without being compromised but may have opportunities for improvement. In other examples, a capture-index assessment may be given the same weight as, or more weight than, a temperature assessment.

Table 2 illustrates an example of a cooling-performance assessment for units of IT equipment for which a temperature assessment and a capture-index assessment are available. Act 314 may therefore include determining, based on the temperature assessment and capture-index assessment, a cooling-performance assessment in the manner illustrated by Table 2. As discussed above, a temperature assessment may be weighted more heavily than a capture-index assessment in determining a cooling-performance assessment in some examples. For example, a "bad" temperature assessment and a "good" capture-index assessment may yield a "bad" cooling-performance assessment in some examples. In another example, however, a "good" temperature assessment and a "bad" capture-index assessment may yield a higher rating of a "marginal" cooling-performance assessment. That is, while Table 2 provides one scheme of determining a cooling-performance assessment, other schemes are within the scope of the disclosure.

In some examples, a capture-index assessment may only lower the cooling-performance assessment to "marginal" in cases in which the temperature is "good." In some examples in which temperatures are "marginal" or "bad," the cooling-performance assessment may be equal to the temperature assessment. Alternatively, the temperature and capture index assessments could be given different weightings depending on the application. That is, while Table 2 provides one example of cooling-performance assessments, in other examples, a cooling-performance assessment may differ from the examples provided in Table 2.

TABLE 2

| Cooling Performance Assessment, Racks with Capture Index Values | | |
|---|---|---|
| Temperature Assessment | Capture-Index Assessment | Cooling-Performance Assessment |
| Good | Good | Good |
| Marginal | Good | Marginal |
| Bad | Good | Bad |
| Good | Marginal | Marginal |
| Marginal | Marginal | Marginal |
| Bad | Marginal | Bad |
| Good | Bad | Marginal |
| Marginal | Bad | Marginal |
| Bad | Bad | Bad |

At act 316, the process 300 ends.

As discussed above and as illustrated in FIGS. 2A-2C, indicators of each of the one or more cooling-performance assessments may be displayed to a user. For example, a simulation may display a 3D model of each unit of IT equipment with a respective indicator of a cooling-performance assessment overlaid on each 3D model. The simulation may further display temperature maps, airflow patterns, and/or other assets with each respective indicator of the cooling performance assessment. As discussed above, the cooling-performance assessment may be a representation of a respective cooling-performance classification, for example, being classified as "good," "marginal," or "bad."

It is to be appreciated that modifications to the process 300 are within the scope of the disclosure, such as by modifying an order of acts of the process 300. For example, a capture-index assessment may be determined prior to, or simultaneously with, determining a temperature assessment in some examples. Furthermore, as discussed above, a different number and/or type of temperature assessments, capture-index assessments, and/or cooling-performance assessments (that is, other than or in addition to "good," "marginal," and "bad") may be implemented in some examples. Accordingly, a table other than Table 2 may be implemented to determine a cooling-performance assessment based on a temperature assessment and/or capture-index assessment in some examples.

As discussed above, act 312 includes determining a capture-index assessment based on a selected one of one or more capture indices. FIG. 5 illustrates a process 500 of selecting a capture index with which to determine a capture-index assessment according to an example. The process 500 may be an example of act 312 and may be executed by a computing device executing the process 300.

At act 502, the process 500 begins.

At act 504, a containment type of an IT space being analyzed is determined. As discussed above with respect to Table 1, one of a HACI or a CACI may be selected based on a containment type. In one example, the containment type may be one of an uncontained type, a cold-aisle type, a hot-aisle type, or a hot-and-cold-aisle type. The containment type may be determined based on the information-technology-device information, which includes location information, received at act 306. As discussed above, the location information may include containment information indicating a containment type. Alternatively, the location information may include information indicative of a position, orientation, and/or physical size of IT devices in a space, such as information indicative of a position, orientation, and physical size of each rack and cooling resource in a data center, which may be used by CFD software to determine a containment type.

At act 506, a determination is made as to whether the containment type is an uncontained type. An uncontained type is one in which there is not a design intent to establish either cold-aisle or hot-aisle containment. In various uncontained architectures, such as an uncontained row-based-cooling architecture, both a CACI and a HACI may be determined for units of IT equipment, because the units of IT equipment may have a cold aisle on one side and a hot aisle on an opposite side. If the containment type is an uncontained type (506 YES), the process 500 continues to act 508.

At act 508, a greater of the CACI and the HACI is used for determining a cooling-performance assessment. For example, if a CACI for a unit of IT equipment is 90%, and a HACI for the unit of IT equipment is 66%, then the CACI is used. The greater of the CACI and the HACI may be selected because the greater capture index may be enough to ensure good cooling airflow delivery to IT inlets or to effectively capture warm IT exhaust before the exhaust has the opportunity to affect IT inlets. In some examples, it may be unnecessarily conservative to both ensure good airflow delivery and to ensure effective exhaust recapture, such that only one capture index need be considered. The process 500 then continues to act 510, and the process 500 ends. Where the process 500 is implemented as an example of act 312, the process 300 may then continue to act 314 to determine a cooling-performance assessment based on the greater of the HACI and the CACI.

Otherwise, if the containment type is not uncontained (506 NO), the process 500 continues to act 512. For example, for containment types other than the uncontained type, a design intent may be more apparent from a configuration of IT equipment. For example, the design intent may place a greater emphasis on recapturing IT exhaust, ensuring good airflow delivery, or a combination of both. It may be advantageous to select a capture index that aligns with the design intent for determining the cooling-performance assessment.

At act 512, a determination is made as to whether a containment type is a hot-and-cold-aisle containment type, that is, in which both hot- and cold-aisle containment are implemented. Consequently, both a CACI and a HACI may be relevant and determined, though only one is selected for determining a cooling-performance assessment. If the containment type is the hot-and-cold-aisle containment type (512 YES), then the process 500 continues to act 514.

At act 514, a lesser of a CACI and a HACI is selected. For example, if a CACI for a unit of IT equipment is 90%, and a HACI for the unit of IT equipment is 66%, then the HACI is selected. In various examples, the design intent of a hot-and-cold-aisle containment architecture may be that both the cold-aisle and hot-aisle containment should "work properly" such that the most limiting capture index (that is, the lower capture index) is used. The process 500 continues to, and ends at, act 510.

Otherwise, if the containment type is not the hot-and-cold-aisle containment type (512 NO), then the process 500 continues to act 516. At act 516, a determination is made as to whether the containment type is a hot-aisle containment type. If the containment type is a hot-aisle containment type (516 YES), then the process 500 continues to act 518.

At act 518, a HACI is used to determine a cooling-performance assessment. Hot-aisle containment may emphasize containing IT-equipment exhaust in a hot-aisle containment. Accordingly, because the design intent may focus on hot-air recapture, which the HACI is indicative of, the HACI may be most useful capture index in determining a cooling-performance assessment.

Otherwise, if the containment type is not the hot-aisle containment type (516 NO), then the process 500 continues to act 520. At act 520, a determination is made that the containment type is a cold-aisle containment type. That is, because a determination has already been made that the containment type is not an uncontained type, hot-aisle type, or hot-and-cold-aisle type, only the cold-aisle type remains in this example. It is to be appreciated that this determination may be limited to examples in which a containment type is known to be one of the four listed containment types, and a determination has already been made that the containment type is not any of the other three containment types.

At act 522, a CACI is used to determine a cooling-performance assessment. Cold-aisle containment may emphasize containing IT-equipment intake in cold-aisle containment.

Accordingly, because the design intent may focus on cold-air supply, which the CACI is indicative of, the CACI may be the most useful capture index in determining a cooling-performance assessment. The process 500 continues to, and ends at, act 510.

Accordingly, the process 500 provides a manner of determining whether to use a CACI or HACI in determining a cooling-performance assessment. It is to be appreciated that modifications to the process 500 are within the scope of the disclosure. For example, an order of the acts 500-522 may be modified in alternate examples, such as by rearranging an order of acts 506, 512, and/or 516. Furthermore, it is to be appreciated that additional and/or different containment types may be considered in alternate examples, and that different rules may be implemented to determine an applicable capture index based on the containment type.

Accordingly, a cooling-performance assessment may be determined for each of several units of IT equipment using a selected capture index. A depiction of the IT equipment may be displayed with each cooling-performance assessment determined at act 314 as illustrated, for example, in FIGS. 2A-2B. The cooling-performance assessment may be displayed together with the IT equipment and additional visualizations, such as a simulated airflow, a temperature-gradient map, and so forth.

Table 3 depicts several examples of generating cooling-performance assessments for IT equipment. Table 3 depicts determinations in accordance with the examples provided above and are intended to be illustrative rather than limiting.

TABLE 3

Cooling Performance Assessment Example Calculations

| | Example 1 | Example 2 | Example 3 |
|---|---|---|---|
| Containment Type | None | Cold | Cold and Hot |
| Inlet Temperature (° C.) | 26.7 | 33 | 25 |
| CACI (%) | N/A | 72 | 92 |
| HACI (%) | N/A | 95 | 100 |
| Temperature Assessment | Good | Bad | Good |
| Capture Index Value | N/A | CACI = 72 | Min(CACI, HACI) = 92 |
| Capture Index Assessment | N/A | Bad | Marginal |
| Cooling Performance Assessment | Good | Bad | Marginal |

In Example 1, temperature information is provided indicating that an IT-inlet-temperature value is 26.7° C. Continuing with the example of FIG. 4, a temperature assessment for the IT equipment is "good." However, no capture indices (that is, HACI or CACI) are provided. For example, the cooling architecture may not include any local cooling such that capture indices are not applicable. Consequently, no capture-index assessment is provided, and a cooling-performance assessment is set equal to the "good" temperature assessment.

In Example 2, temperature information is provided indicating that an IT-inlet-temperature value is 29.4° C. Continuing with the example of FIG. 4, a temperature assessment for the IT equipment is "bad." Additionally, a HACI of 95% and a CACI of 72% are provided. A containment type is determined to be a cold-aisle containment type, and the CACI is therefore used to determine a capture-index assessment. Continuing with the example of FIG. 4, a capture-index assessment for a capture index of 72% is "bad." Pursuant to Table 2, above, a "bad" temperature assessment and a "bad" capture-index assessment yields a determination of a "bad" cooling-performance assessment. The cooling-performance assessment for the unit of IT equipment is therefore determined to be "bad."

In Example 3, temperature information is provided indicating that an IT-inlet-temperature value is 25° C. Continuing with the example of FIG. 4, a temperature assessment for the IT equipment is "good." Additionally, a HACI of 100% and a CACI of 92% are provided. A containment type is determined to be a hot-and-cold-aisle containment type, so a lesser of the HACI and the CACI is used. The CACI of 92% is less than the HACI of 100%, and the CACI is therefore used to determine a capture-index assessment. Continuing with the example of FIG. 4, a capture-index assessment for a capture index of 92% is "good." Pursuant to Table 2, above, a "good" temperature assessment and a "good" capture-index assessment yields a determination of a "good" cooling-performance assessment. The cooling-performance assessment for the unit of IT equipment is therefore determined to be "good."

In light of the foregoing, a cooling-performance assessment for use with IT equipment in an IT room is provided. The cooling-performance assessment may be determined in connection with a CFD simulation. In various examples, the IT equipment may include server racks, and the IT room may be a data center. Cooling-performance assessments may be determined and used in visualizations together with representations of IT equipment and other information, such as airflow patterns and temperature gradients, which provides a simple and fast assessment of IT-room cooling performance. However, it is to be appreciated that the cooling-performance assessment principles discussed above may be implemented in other environments, including CFD simulations in environments other than data centers.

As discussed above, the cooling-performance assessments discussed at least in connection with FIGS. 2A-5 may be indicative of an IT rack cooling check for each individual IT rack. In various examples, a cooling-performance assessment may additionally or alternatively include a cooling-effectiveness metric indicative of how effectively a room of multiple devices (for example, a data center having multiple IT racks) is cooled Similar to the IT rack cooling check, the cooling-effectiveness metric may include an overall classification as "good," "marginal," or "bad."

The cooling-effectiveness metric may be determined based on one or more of a cooling-airflow-return effectiveness (or "return effectiveness"), a cooling-airflow-supply effectiveness (or "supply effectiveness"), one or more IT rack cooling checks, and/or a rack cooling metric. As discussed above, the supply effectiveness may be a parameter indicative of how effectively cooling air is directly supplied to IT racks. The return effectiveness may be a parameter indicative of how effectively hot air is directly captured from the IT racks. The rack cooling metric may be indicative of how effectively IT racks are cooled pursuant to industry standards. For example, the rack cooling metric may be or include the RCI.

In some examples, the cooling-effectiveness metric may be calculated based on fewer than all of the above parameters. For example, the cooling-effectiveness metric may be calculated based on several IT rack cooling checks and the supply effectiveness, but may not be calculated based on the return effectiveness nor the rack cooling metric. However, in some examples, the return effectiveness and/or the rack cooling metric may still be calculated and displayed to a user, although these parameters are not used to calculate the cooling-effectiveness metric. In various examples, the cooling-effectiveness metric may be calculated at least based on the IT rack cooling checks, and may optionally be calculated based on additional parameters, such as the return effectiveness, supply effectiveness, and/or the rack cooling metric.

Figure 6:
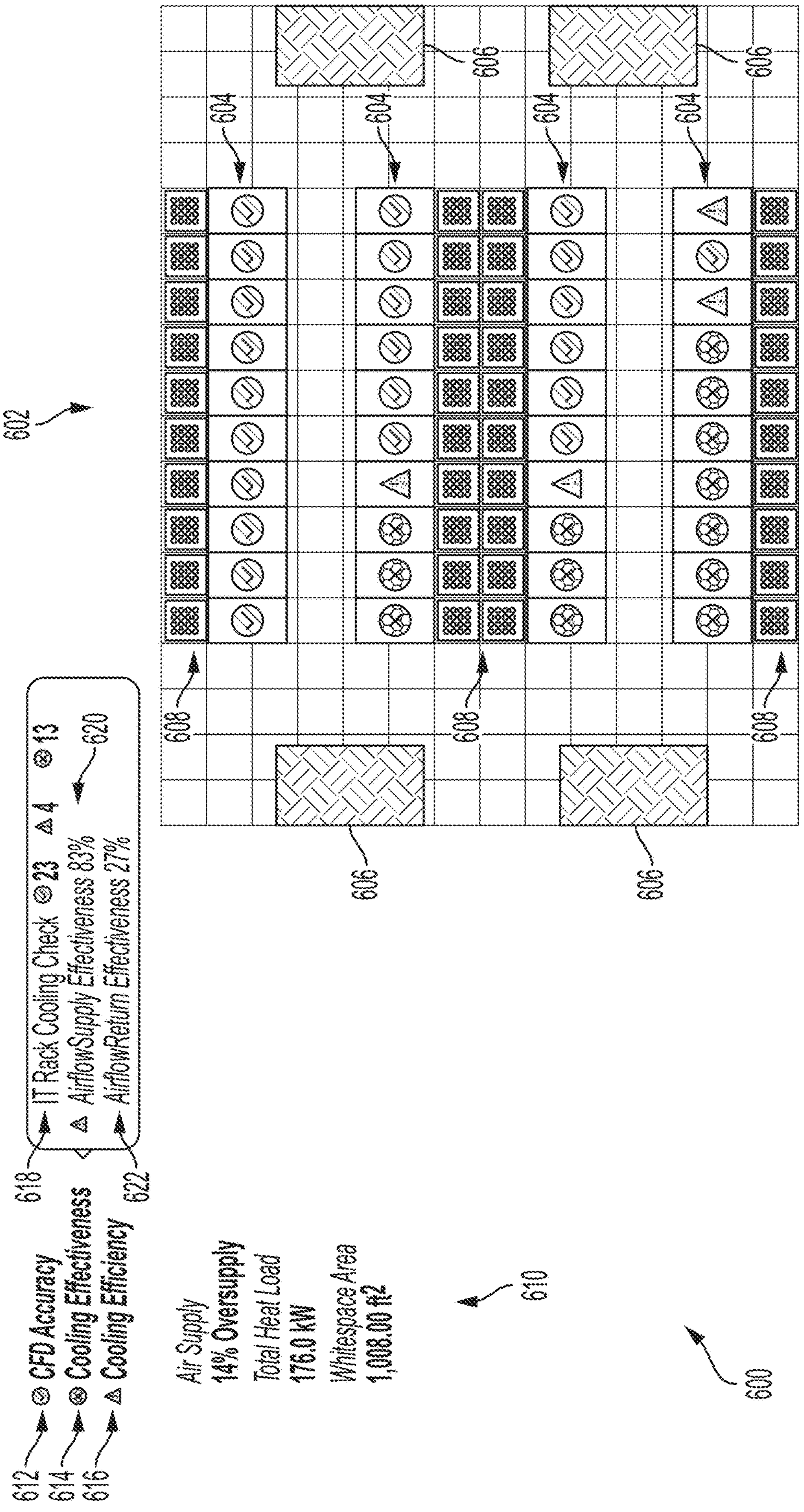
FIG. 6 illustrates a schematic diagram of a simulation display depicting cooling-effectiveness information for a data center according to an example.

A simulation may be displayed (for example, via a GUI) to illustrate the cooling-effectiveness metric. The simulation may be displayed after (for example, responsive to) a user selects an "Analyze" button to analyze a space and generate the simulation. In some examples, the simulation may also display one or more additional parameters, such as the parameters used to determine the cooling-effectiveness metric. Multiple example simulation displays are within the scope of the disclosure. For example, FIG. 6 illustrates a schematic diagram of a simulation display 600 depicting cooling-effectiveness information for a data center according to a first example. The simulation display 600 includes a representation of a data center 602 including IT racks 604, coolers 606, and perforated tiles 608. The coolers 606 include cooling supplies (for example, underneath the coolers 606) and cooling returns (for example, on the top faces of the coolers 606).

The simulation display 600 further includes an information dashboard 610 including a CFD accuracy metric 612, a cooling-effectiveness metric 614, and a cooling-efficiency metric 616. Interacting with the cooling-effectiveness metric 614 displays additional information including, in the illustrated example, IT rack cooling check information 618, supply effectiveness information 620, and return effectiveness information 622.

The IT racks 604 are displayed with respective overlaid IT rack cooling checks (that is, cooling-performance assessments for each individual IT rack). As discussed above, the IT rack cooling checks may be determined based on how effectively each IT rack is cooled, which may be based on features of the coolers 606 (for example, based on features of the cooling supplies and/or airflow returns of the coolers 606). The IT rack cooling checks, as discussed above, may be represented by symbols including green checks (indicative of "good" performance), yellow triangles (indicative of "marginal" performance), and red X marks (indicative of "bad" performance). In some examples, a user may interact with any of the IT racks 604 (for example, by hovering a cursor over a respective rack) to display additional information about the respective rack, as discussed below with respect to FIG. 11.

Similarly, the CFD accuracy metric 612, the cooling-effectiveness metric 614, and the cooling-efficiency metric 616 may each be displayed with a "good," "marginal," or "bad" symbol. In other examples, different symbols and/or assessments may be provided for one or more of the metrics 612, 614, 616. For example, in one example, the cooling-efficiency metric 616 may be displayed with a "good" symbol (for example, a green check) or a "warning" symbol (for example, a yellow triangle that looks substantially identical to the "marginal" symbol discussed above), but no "bad" symbol may be provided. For purposes of example, the description herein refers to scenarios in which the cooling-efficiency metric 616 is either "good," "marginal," or "bad," but similar principles apply where the cooling-efficiency metric 616 is either "good" or "warning."

The cooling-effectiveness metric 614 may be determined based on the "worst" of the parameters used to determine the cooling-effectiveness metric 614. For example, if any of the parameters used to determine the cooling-effectiveness metric 614 are "bad," then the cooling-effectiveness metric 614 may be "bad"; similar principles apply to "marginal." In various examples, the cooling-effectiveness metric 614 may only be considered "good" if none of the parameter used to determine the cooling-effectiveness metric 614 are "bad" or "marginal." In the illustrated example, the cooling-effectiveness metric 614 is determined based on the IT rack cooling check information 618 and the supply effectiveness information 620.

The IT rack cooling check information 618 includes each of the IT rack cooling checks and includes 23 "good" assessments for the IT racks 604, four "marginal" assessments of the IT racks 604, and 13 "bad" assessments for the IT racks 604. The supply effectiveness information 620 includes a calculation of 83% effectiveness and includes a "marginal" assessment for the effectiveness of the cooling-supply capabilities of the coolers 606. The return effectiveness information 622 includes a calculation of 27% effectiveness which is provided for purposes of information only. The return effectiveness information 622 is not used to calculate the cooling-effectiveness metric 614 in the illustrated example and thus does not include an assessment. Furthermore, the rack cooling metric is not used to calculate the cooling-effectiveness metric 614 in the illustrated example nor is the rack cooling metric calculated for informational purposes, and therefore is not displayed.

Accordingly, the cooling-effectiveness metric 614 is determined based on the "worst" assessment of the IT rack cooling check information 618 and the supply effectiveness information 620. The "worst" assessment in this example is the IT rack cooling check information 618, which includes 13 "bad" assessments. Because the IT rack cooling check information 618 includes at least one "bad" assessment, the cooling-effectiveness metric 614 is determined to be "bad" by using this "worst" assessment.

Figure 7:
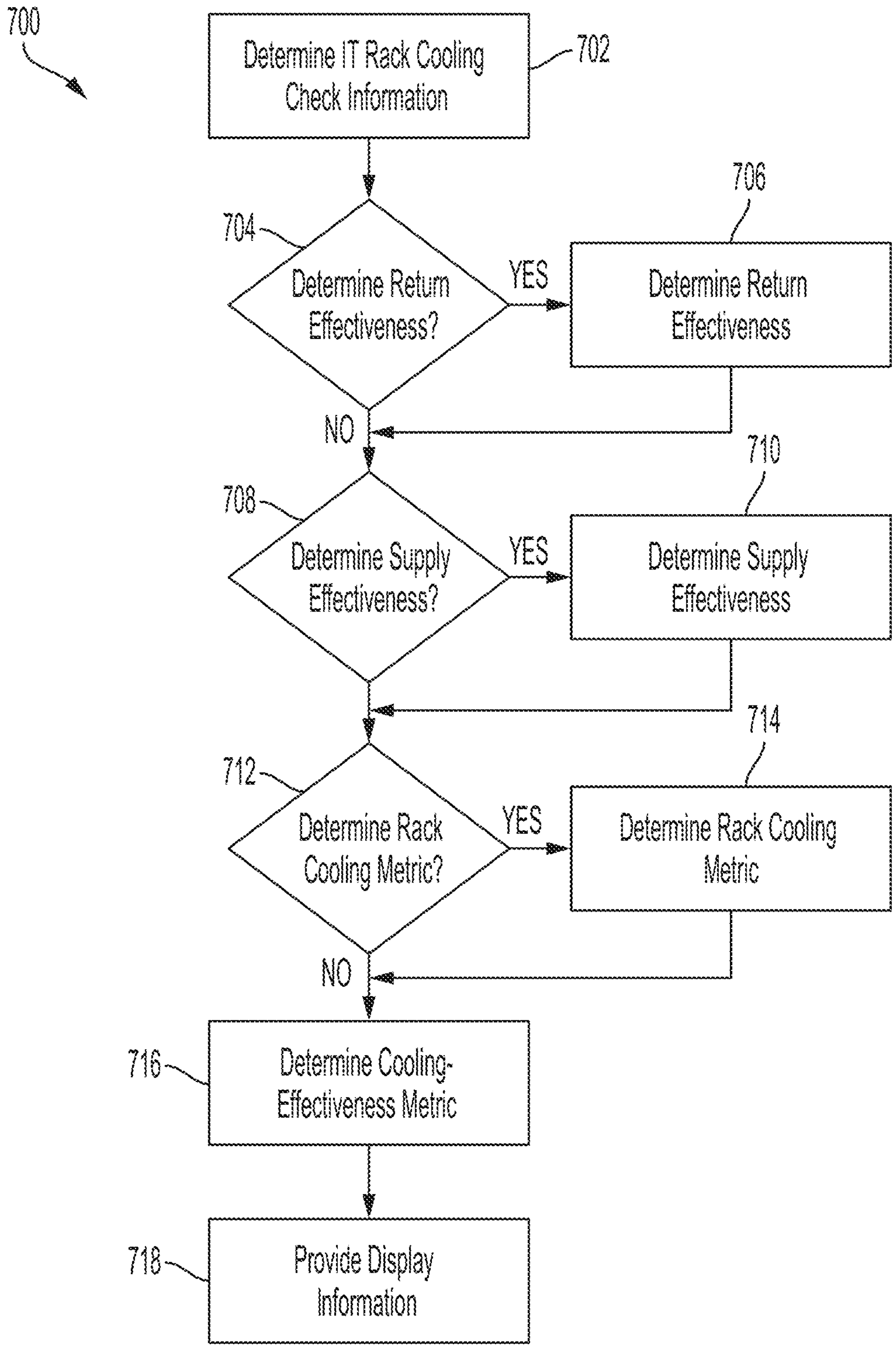
FIG. 7 illustrates a process of determining a cooling-effectiveness metric according to an example.

FIG. 7 illustrates a process 700 of determining a cooling-effectiveness metric according to an example. For purposes of example, the process 700 will be described with respect to the simulation display 600. The process 700 may be executed to determine a cooling-effectiveness metric for an IT room containing IT equipment, such as the data center 602 containing the IT racks 604 which, in turn, house IT equipment. The process 700 may be executed in connection with, or as part of, CFD software. A computing device, which may be local to or remote from an IT room containing the analyzed IT equipment, may execute the process 700 to aid a user in designing or analyzing the IT room. For example, the computing device may include one or more controllers to execute the process 700.

At act 702, the computing device determines IT rack cooling check information for the IT equipment. The computing device may determine an IT rack cooling check for each of the IT racks 604 which, in turn, make up the IT rack cooling check information 618 at least in part. Determining the IT rack cooling checks may include the computing device executing the process 300 one or more times. Using the simulation display 600 as an example, executing act 702 with respect to the IT racks 604 includes determining that 23 of the IT racks 604 exhibit "good" cooling, four exhibit "marginal" cooling, and 13 exhibit "bad" cooling as indicated by the IT rack cooling check information 618 and the visually overlaid symbols. Accordingly, an overall assessment of the IT rack cooling check information 618 is "bad" when using a "worst" assessment.

At act 704, the computing device determines whether to determine a return effectiveness. Whether to determine the return effectiveness may be based on an architecture of the IT room. For example, if the IT room implements a raised-floor architecture for which a design focus is primarily on supplying cooling airflow to the IT racks 604, it may not be necessary and/or desirable to evaluate the return effectiveness. In some examples, the computing device may automatically determine whether to determine the return effectiveness. In various examples, a user may manually select whether the return effectiveness is to be determined.

In some examples, the return effectiveness may be determined for informational purposes only, without being used to determine the cooling-effectiveness metric. For example, a user may provide a user input to the computing device requesting that the return effectiveness be determined for informational purposes only. In another example, the computing device may be configured to automatically determine the return effectiveness for informational purposes even if the return effectiveness is not used for determining the cooling-effectiveness metric. If the computing device determines that the return effectiveness should be determined (704 YES), then the process 700 continues to act 706. Otherwise, if the computing device determines that the return effectiveness should not be determined (704 NO), then the process 700 continues to act 708. In the example of FIG. 6, the return effectiveness information 622 may be determined for informational purposes but is not used to determine the cooling-effectiveness metric 614.

At act 706, the computing device determines the return effectiveness. The return effectiveness may be expressed as a percentage of overall airflow directly captured from IT exhausts, such as by the airflow returns of the coolers 606. For example, the return effectiveness information 622 indicates that 27% of air output by IT exhausts is directly captured by the airflow returns of the coolers 606. As used herein, being captured "directly" means that the air does not pass through other IT equipment, cooling units, or any other equipment capable of providing heating and/or cooling to the air, between the IT exhaust of the racks 604 and the airflow returns of the coolers 606.

In various examples, an assessment, such as "good," "marginal," and "bad," may also be assigned to the return effectiveness. Each assessment may correspond to a range of percentage values. For example, a "good" assessment may correspond to percentage values from 90% to 100%, a "marginal" assessment may correspond to percentage values from 80% to 89.9%, and a "bad" assessment may correspond to percentage values below 80%. However, if the return effectiveness is not used to determine a cooling-effectiveness metric, then an assessment for the return effectiveness may not be assigned to the return effectiveness. For example, the return effectiveness may not be calculated because the IT-room architecture does not rely on a high return effectiveness, and it may therefore be unimportant to provide such an assessment. A method of determining the return effectiveness is discussed in greater detail below.

At act 708, the computing device determines whether to determine the supply effectiveness. In some examples, the computing device may automatically determine whether to determine the supply effectiveness. In various examples, a user may manually select whether the supply effectiveness is to be determined. Whether to determine the supply effectiveness may be based on an architecture of the IT room. In some examples, the supply effectiveness may be calculated for informational purposes only, without being used to determine the cooling-effectiveness metric. If the computing device determines that the supply effectiveness should be determined (708 YES), then the process 700 continues to act 710. Otherwise, if the computing device determines that the supply effectiveness should not be determined (708 NO), then the process 700 continues to act 712. In the example of FIG. 6, the supply effectiveness information 620 is determined and is used to determine the cooling-effectiveness metric 614.

At act 710, the computing device determines the supply effectiveness. The supply effectiveness may be expressed as a percentage of overall airflow directly supplied from cooling units to IT equipment, such as from the coolers 606 to the IT racks 604, which house IT equipment. For example, the supply effectiveness information 620 indicates that 83% of air provided by the coolers 606 is directly supplied to the IT racks 604. As used herein, being provided "directly" means that the air does not pass through other IT equipment, cooling units, or any other equipment capable of providing heating and/or cooling to the air, between the coolers 606 and the IT racks 604.

In various examples, an assessment, such as "good," "marginal," and "bad," may also be assigned to the supply effectiveness. Each assessment may correspond to a range of percentage values. For example, a "good" assessment may correspond to percentage values from 90% to 100%, a "marginal" assessment may correspond to percentage values from 80% to 89.9%, and a "bad" assessment may correspond to percentage values below 80%. For example, in the example of FIG. 6, the supply effectiveness information 620 indicates that the supply effectiveness of 83% corresponds to a "marginal" assessment. However, if the supply effectiveness is not used to determine a cooling-effectiveness metric, then an assessment for the supply effectiveness may not be assigned to the supply effectiveness. A method of determining the return effectiveness is discussed in greater detail below.

At act 712, the computing device determines whether to determine a rack cooling metric. In some examples, the computing device may automatically determine whether to determine the rack cooling metric. In various examples, a user may manually select whether the rack cooling metric is to be determined. Whether to determine the rack cooling metric may be based on the type of IT equipment installed in a data center, data-center-operator preferences, and/or other considerations. In some examples, the rack cooling metric may be calculated for informational purposes only, without being used to determine the cooling-effectiveness metric. If the computing device determines that the rack cooling metric should be determined (712 YES), then the process 700 continues to act 714. Otherwise, if the computing device determines that the rack cooling metric should not be determined (712 NO), then the process 700 continues to act 716. In the example of FIG. 6, the rack cooling metric is not determined for informational purposes nor to determine the cooling-effectiveness metric 614, and is therefore not displayed.

At act 714, the computing device determines the rack cooling metric. The rack cooling metric, which may include the RCI, may indicate a degree of compliance with rack-air-intake-temperature ranges, which may be specified by standards such as ASHRAE. For example, ASHRAE may specify a range of desirable temperature values. The rack cooling metric may indicate a degree to which the racks 604 comply with these ranges. The rack cooling metric may be determined based not only on whether a given rack is outside of the temperature range, but also how far outside of the temperature range the air-intake temperature is. For example, if only a single rack is outside of the temperature range, the rack cooling metric may be lower where the single rack is five degrees outside of the temperature range as opposed to if the single rack is only one degree outside of the temperature range. The computing device may use air-intake temperatures for each of the racks 604 to determine the rack cooling metric using CFD software. In various examples, an assessment, such as "good," "marginal," and "bad," may also be assigned to the rack cooling metric. Each assessment may correspond to a range of percentage values.

At act 716, the computing device determines the cooling-effectiveness metric. The cooling-effectiveness metric may be expressed as "good," "marginal," or "bad." In some examples, the cooling-effectiveness metric may be selected based on the "worst" assessment of the assessments used to determine the cooling-effectiveness metric. In other examples, the cooling-effectiveness metric may be determined differently. For example, the cooling-effectiveness metric may only be considered "bad" if a certain number of assessments used to determine the cooling-effectiveness metric are "bad," such as if a certain percentage or set number of the assessments used to determine the cooling-effectiveness metric are "bad." Similar principles apply to the "marginal" and "good" assessments.

As discussed above, in some examples the cooling-effectiveness metric is determined based on IT rack cooling check information and, optionally, one or more of the return effectiveness, supply effectiveness, and/or rack cooling metric. In some examples, a user may manually select which of the parameters to use in determining the cooling-effectiveness metric. In other examples, the computing device may automatically select which of the parameters to use in determining the cooling-effectiveness metric.

In the example of FIG. 6, the cooling-effectiveness metric 614 is determined based on the IT rack cooling check information 618, which includes 23 "good" assessments, four "marginal" assessments, and 13 "bad" assessments, and based on the supply effectiveness, which includes a "marginal" assessment based on the supply effectiveness of 83%. Using a "worst" assessment to set the cooling-effectiveness metric 614, the cooling-effectiveness metric 614 is set to "bad" because one or more of the assessments used to determine the cooling-effectiveness metric 614 (that is, 13 "bad" assessments in the IT rack cooling check information 618) are "bad."

At act 718, the computing device provides display information indicative of at least the cooling-effectiveness metric. For example, the display information may be used to display the simulation display 600. Providing the display information may include displaying the simulation display 600 on a display and/or storing the display information in memory and/or storage for later use. As indicated by the simulation display 600, the display information may include information in addition to the cooling-effectiveness metric 614, as discussed above with respect to FIG. 6.

As discussed above, the return effectiveness and supply effectiveness may be determined at acts 706 and 710, respectively. The return effectiveness and supply effectiveness may indicate how effectively the racks 604 are cooled. The racks 604 may contain IT equipment, such as servers, which are the heat-producing components that are ultimately intended to be cooled. Determining the return effectiveness and the supply effectiveness may therefore depend at least in part on how a rack, and the IT equipment housed therein, is represented for performing CFD analysis.

Each IT rack may be represented with explicit representations of air inlet and exhaust terminals, which may be built directly into certain CFD software. In some examples, a region in which airflow, pressures, temperatures, and so forth are predicted by the CFD model is in direct contact with the IT terminals which may or may not extend inside the rack. Alternatively, compact rack models may be employed which appear as "black boxes" to a parent CFD model and use a separate model to predict airflow physics inside the racks. In some examples, the region in which airflow, pressures, temperatures, and so forth are predicted by the CFD model may not extend inside the rack and IT inlet and exhaust terminals are not explicitly visible in or part of the parent CFD model.

Figure 8:
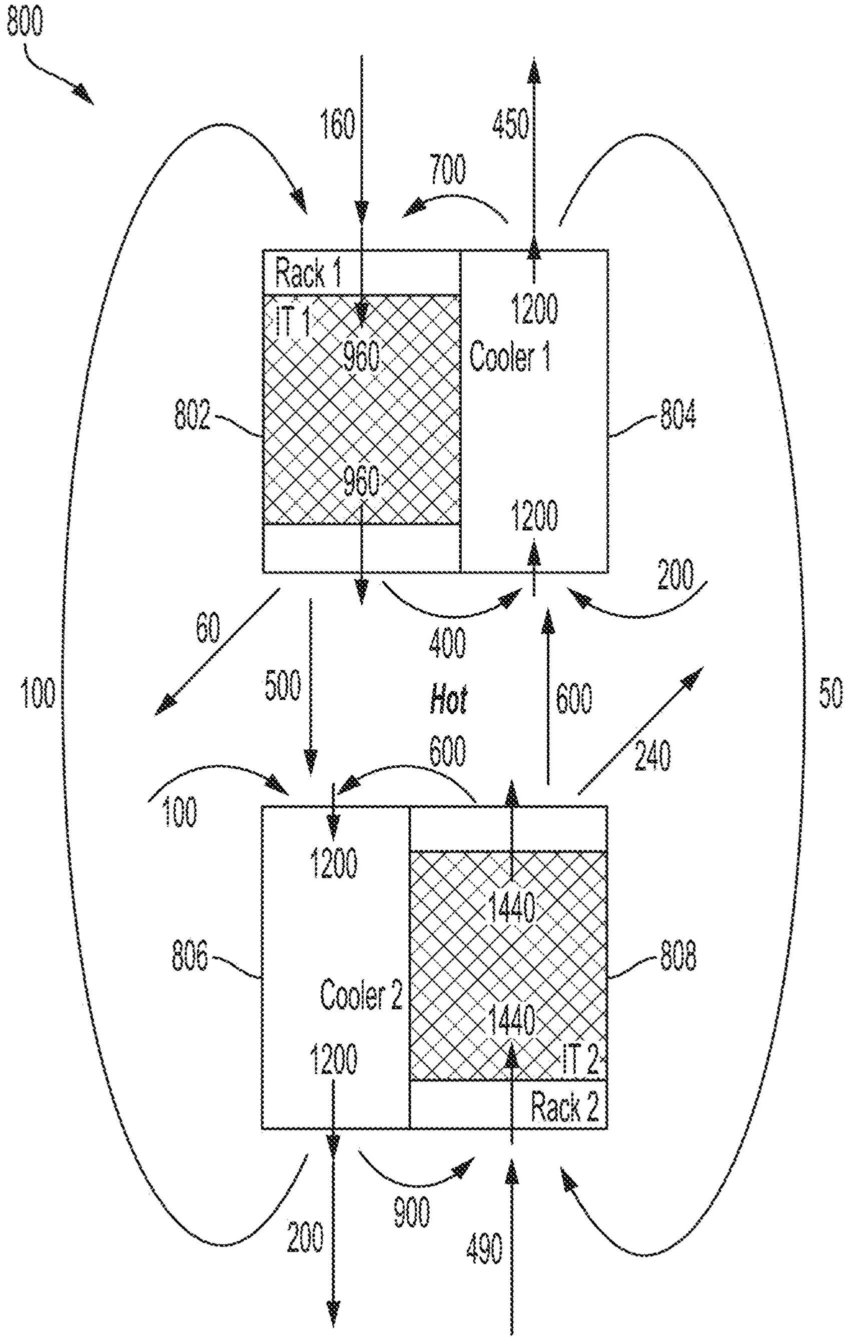
FIG. 8 illustrates a schematic diagram of a CFD simulation for a data center according to an example.

In one example, IT equipment terminals may be modeled in CFD. FIG. 8 illustrates a schematic diagram of a CFD simulation 800 for a data center according to an example. The CFD simulation 800 includes a first rack housing IT equipment 802, a first cooling unit 804, a second rack housing IT equipment 806, and a second cooling unit 808. Inlet and exhaust terminals are represented by arrows showing airflow into and out of the components 802-808. Unitless values indicate volumetric flow rates of airflow, with units being omitted as only relative values are used as discussed below. In the example of FIG. 8, inlet and exhaust airflows for the racks are considered to be identical to those of the IT equipment housed by the respective racks.

Supply effectiveness may be calculated as a percentage of the total airflow into a rack that is supplied directly from cooling units. Return effectiveness may be calculated as a percentage of the total airflow out of a rack that is returned directly to coolers. In the example of FIG. 8, therefore, the supply effectiveness Cs and the return effectiveness IR may be calculated as, $$\varepsilon_S = \frac{IT \text{ inlet airflow directly from coolers}}{IT \text{ airflow}} = \frac{700+100+900+50}{960+1440} = 72.9\% \quad (1)$$

$$\varepsilon_R = \frac{IT \text{ exhuast airflow directly to coolers}}{IT \text{ airflow}} = \frac{500+400+600+600}{960+1440} = 87.5\% \quad (2)$$

In various examples, the airflow patterns depicted in FIG. 8 and discussed with respect to Equations (1) and (2) may not be computed directly by the CFD software. Instead, airflow patterns may be tracked by the CFD software using "concentrations," which act as a numerical smoke source. The concentrations are given physical properties (for example, density, viscosity, and so forth) identical to those of the surrounding air so that the concentrations do not affect airflow patterns in the CFD software. When determining supply effectiveness, the concentration at the cooler supplies (that is, where air is initially output by the cooling units), C, is set to 1, that is, 100% numerical smoke. The resulting distribution of C may then be determined for the remainder of the room. Supply effectiveness may therefore be calculated as, $$\varepsilon_S = \frac{\sum_{i=1}^{n} C_i^{ITI} Q_i^{IT}}{\sum_{i=1}^{n} Q_i^{IT}} = \frac{\left(\frac{700+100}{960}\right)(960) + \left(\frac{900+50}{1440}\right)(1440)}{960+1440} = 72.9\% \quad (3)$$

where $$C_i^{ITI}$$

is the average concentration at IT inlet i, $$Q_i^{IT}$$

is the airflow rate of IT equipment i, and n is the number of individual pieces of IT equipment.

Similarly, to determine return effectiveness, the concentration C at each exhaust may be set to 1 and, again, the resulting distribution of C may be determined for the remainder of the room. Return effectiveness may therefore be calculated as, $$\varepsilon_R = \frac{\sum_{j=1}^{n} C_j^{CR} Q_j^{C}}{\sum_{i=1}^{n} Q_i^{IT}} = \frac{\left(\frac{600+400}{1200}\right)(1200) + \left(\frac{500+600}{1200}\right)(1200)}{960+1440} = 87.5\% \quad (4)$$

where $$C_j^{CR}$$

is the average concentration at cooling-unit return j, $$Q_j^{C}$$

is the airflow rate of cooling unit j, and N is the number of cooling units.

Accordingly, to determine the supply effectiveness and return effectiveness, the average concentration at the IT inlet i, $$C_i^{ITI},$$

and the average concentration at the cooling-unit return j, $$C_j^{CR},$$

may be computed by CFD software using the numerical-smoke-based approach discussed above. The supply effectiveness and return effectiveness may then be determined pursuant to Equations (3) and (4).

In various examples, the compact-rack model does not include explicit representations of inlets and exhausts in the CFD software. Accordingly, a need may exist to factor the airflow activity within the racks into the supply and return effectiveness calculations.

Figure 9:
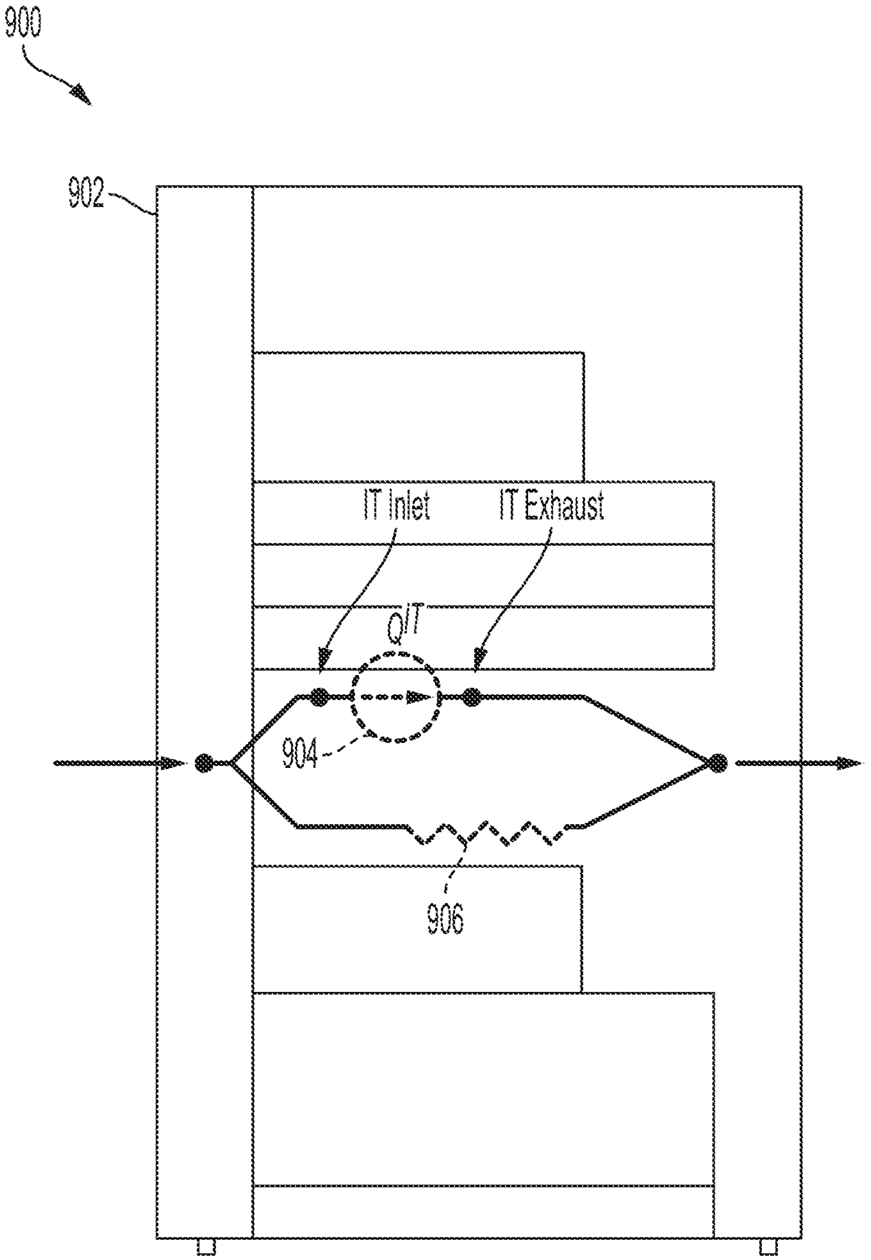
FIG. 9 illustrates a schematic diagram of a rack model according to an example.

FIG. 9 illustrates a schematic diagram of a rack model 900 according to an example. The rack model 900 represents airflow through a rack 902, with airflow being left-to-right in FIG. 9 to represent air entering a front of the rack 902 and exiting a back of the rack 902. Within the rack model 900, a first portion of the airflow is driven by an exhaust fan, which may direct the airflow in a desired path, but a remaining, second portion of the airflow, referred to as leakage airflow, may be driven by pressure drops within the rack 902. The first portion of the airflow is represented by an IT fan airflow $Q^{IT}$ 904, and the second portion of the airflow, or leakage airflow, is represented as passing through flow resistance 906. The rack model 900 may be periodically synchronized with the CFD model such that the leakage airflow is consistent with the pressure drop across the faces of the rack 902. Accordingly, the rack model 900 may advantageously include rack-leakage physics and may accurately distinguish between IT equipment and rack inlets and/or exhausts.

Figure 10:
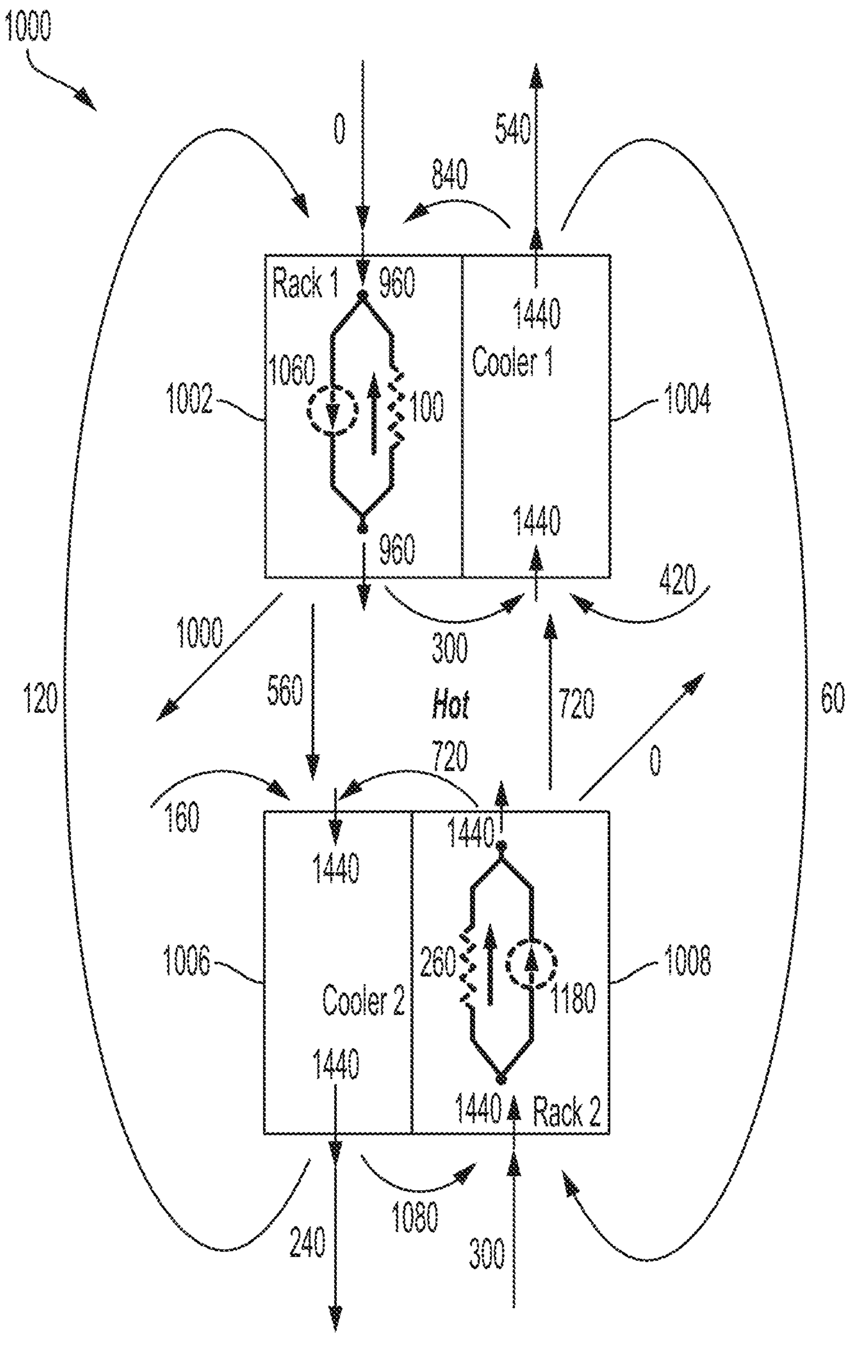
FIG. 10 illustrates a schematic diagram of a CFD simulation for a data center according to an example.

FIG. 10 illustrates a schematic diagram of a CFD simulation 1000 for a data center according to an example. The CFD simulation 1000 includes a first rack housing IT equipment 1002, a first cooling unit 1004, a second rack housing IT equipment 1006, and a second cooling unit 1008. Inlet and exhaust terminals are represented by arrows showing airflow into and out of the components 1002-1008. Unitless values indicate volumetric flow rates of airflow, with units being omitted as only relative values are used as discussed below.

The CFD simulation 1000 is similar to the CFD simulation 800. However, the first rack housing IT equipment 1002 and the second rack housing IT equipment 1006 are represented by rack models similar to the rack model 900.

To compute supply effectiveness pursuant to the CFD simulation 1000, the rack inlet airflow (for example, through a rack front door) concentration C is set to 1. The cooling-unit supplies are also set to C=1, and the concentrations at each rack inlet i, $$C_i^{RI},$$

are determined. The supply effectiveness is computed as, $$\varepsilon_S = \frac{\sum_{i=1}^{n} C_j^{ITI} Q_i^{RI} Q_i^{IT}}{\sum_{i=1}^{n} Q_i^{IT}} = \frac{\left(\frac{960}{1060}\right)\left(\frac{840+120}{960}\right)(1060) + \left(\frac{1180}{1180}\right)\left(\frac{1080+60}{1440}\right)(1180)}{1060+1180} = 84.6\% \tag{5}$$

Similarly, to compute the return effectiveness, the concentration at each rack exhaust i, $$C_i^{RE},$$

is computed using the exhaust from the racks 1002, 1006 inside the rack model at C=1. Accordingly, as illustrated by FIG. 10, the concentrations at each exhaust are $$C_1^{RE} = \frac{960}{960} = 1 \text{ and } C_2^{RE} = \frac{e}{1440} = 0.819.$$

These values may be used as rack-exhaust concentrations in CFD from which the concentrations at the returns of the cooling units 1004, 1008 are determined. The return effectiveness is computed as, $$\varepsilon_R = \frac{\sum_{j=1}^{N} C_j^{CR} Q_j^{C}}{\sum_{i=1}^{n} Q_i^{IT}} = \frac{\left(\frac{(1)(300)+(0.819)(720)}{1440}\right)(1440) + \left(\frac{(1)(560)+(0.819)(720)}{1440}\right)(1440)}{1060+1180} = 91.1\% \tag{6}$$

In this example, the return effectiveness that is calculated using Equation (8) (that is, by using a compact-rack model) is identical to the return effectiveness that is calculated using Equation (4) (that is, by using an explicit-IT model). When calculating using the explicit-IT model pursuant to Equation (4), the exhaust concentration may always be set to C=1, whereas when using compact-rack models pursuant to Equation (8), C may be less than 1 due to recirculation inside the rack. Accordingly, provided that IT exhaust and rack exhaust concentrations have been set in an applicable CFD model, either Equation (4) or Equation (8) may be used for a mixed population of explicitly represented IT terminals and compact racks.

Figure 11:
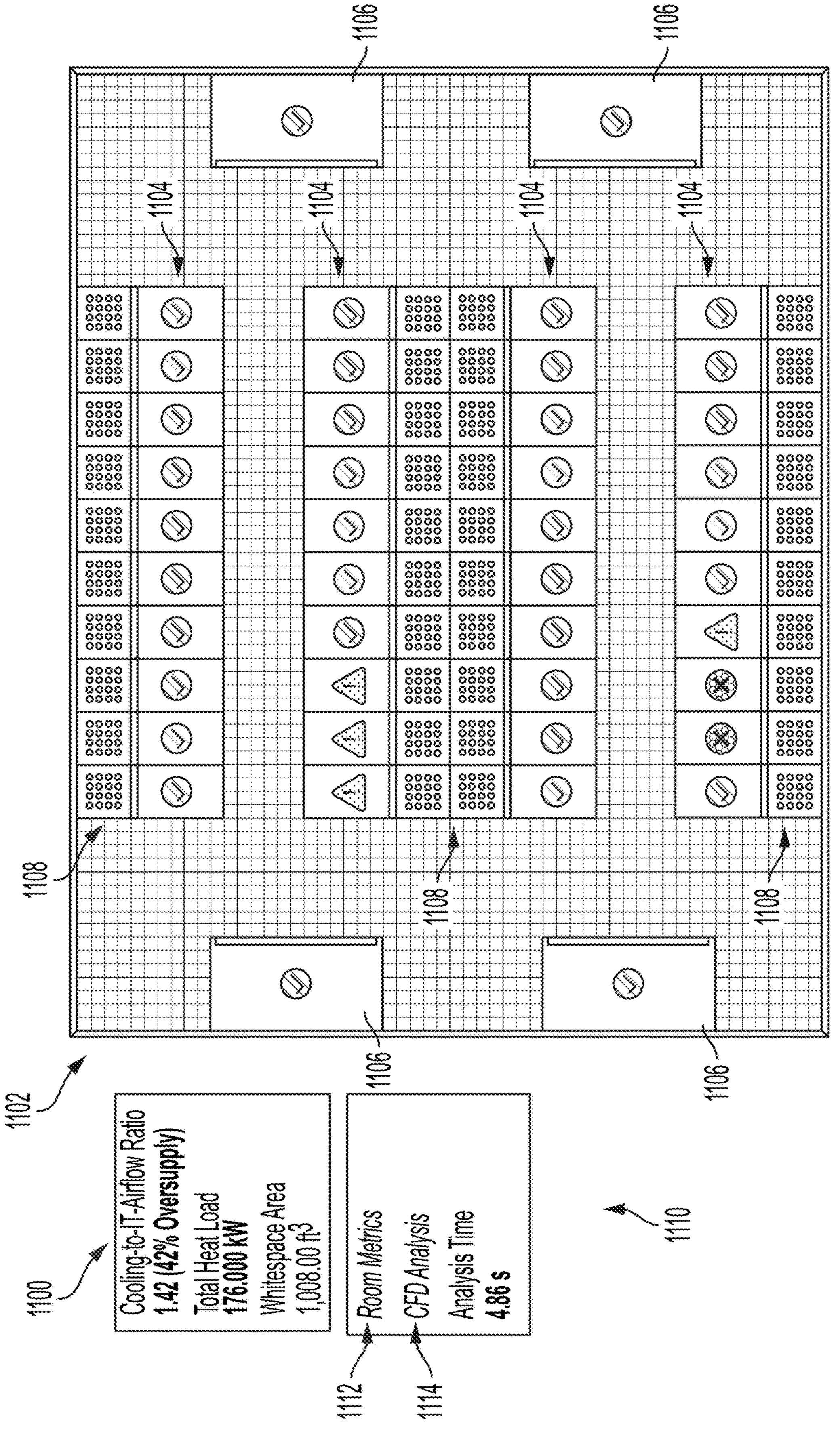
FIG. 11 illustrates a schematic diagram of a simulation display according to an example.

As discussed above, the simulation display 600 provides one example of a display. In some examples, additional or different information may be shown in a display, or may be categorized or displayed differently. FIG. 11 illustrates a schematic diagram of a simulation display 1100 depicting information for a data center according to another example. The simulation display 1100 includes a representation of a data center 1102 including IT racks 1104, coolers 1106, and perforated tiles 1108. The simulation display 1100 further includes an information panel 1110. The information panel 1110 includes room-metrics information 1112 and CFD-analysis information 1114, as discussed in greater detail below.

The coolers 1106 include cooling supplies (for example, underneath the coolers 1106) and cooling returns (for example, on the top faces of the coolers 1106). The IT racks 1104 are displayed with respective overlaid IT rack cooling checks (that is, cooling-performance assessments for each individual IT rack). As discussed above, the IT rack cooling checks may be determined based on how effectively each IT rack is cooled, which may be based on features of the coolers 1106 (for example, based on features of the cooling supplies and/or airflow returns of the coolers 1106). The IT rack cooling checks, as discussed above, may be represented by symbols including green checks (indicative of "good" performance), yellow triangles (indicative of "marginal" performance), and red X marks (indicative of "bad" performance). In some examples, a user may interact with any of the IT racks 1104 (for example, by hovering a cursor over a respective rack) to display additional information about the respective rack.

Figure 12A:
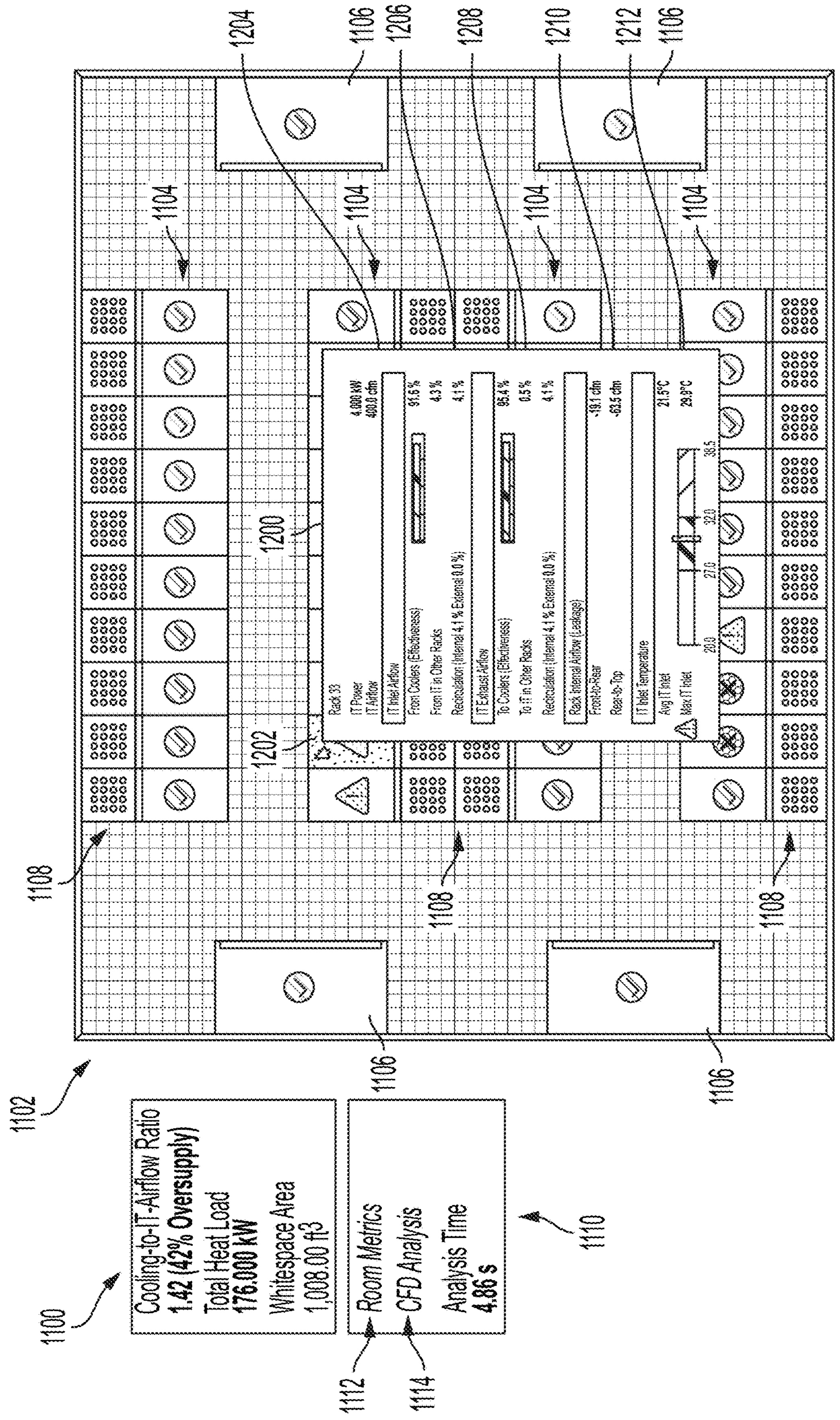
FIG. 12A illustrates a schematic diagram of a simulation display with additional rack information according to an example.

For example, FIG. 12A illustrates a schematic diagram of the simulation display 1100 including additional rack information 1200 for a first rack 1202. The additional information 1200 may be displayed responsive to a user interacting with (for example, hovering a cursor over) the first rack 1202 of the IT racks 1104. The additional rack information 1200 includes rack-specific information for the first rack 1202, including power and airflow specifications 1204, inlet-airflow information 1206, exhaust-airflow information 1208, internal airflow information 1210, and inlet temperature information 1212.

The power and airflow specifications 1204 indicate a rated power consumption and rated airflow volume of the first rack 1202. The inlet-airflow information 1206 indicates a percentage of inlet airflow that is received from the coolers 1106, a percentage of inlet airflow that is recirculated from the first rack 1202 itself, and a percentage of inlet airflow that is received from other racks of the IT racks 1104. The exhaust-airflow information 1208 indicates a percentage of exhaust airflow from the first rack 1202 that is captured by the coolers 1106, a percentage of exhaust airflow that is recirculated back to the first rack 1202 itself, and a percentage of exhaust airflow that is provided to other racks of the IT racks 1104. The internal airflow information 1210 indicates a volume of airflow that is leaked from the front of the first rack 1202 to the rear of the first rack 1202, and a volume of airflow that is leaked from the rear of the first rack 1202 to the top of the first rack 1202. The inlet temperature information 1212 indicates an average and maximum temperature of air received at the inlet of the first rack 1202.

As illustrated in the additional rack information 1200, the inlet temperature information 1212 includes a "marginal" assessment symbol next to the maximum inlet temperature information. A vertical line indicating a value of the maximum temperature for the first rack 1202 is situated between 27° C. and 32° C., which may be a range of temperatures corresponding to the "marginal" assessment. Maximum temperatures below 27° C. may correspond to the "good" assessment, and maximum temperatures above 32° C. may correspond to the "bad" assessment. Because the value of the maximum temperature of the first rack 1202 is between 27° C. and 32° C., the assessment is "marginal."

In various examples, the data center 1102 may be implemented according to an architecture with no containment. Accordingly, the overall IT rack cooling check for the first rack 1202 may be based strictly on the temperature assessment of "marginal." Thus, the overall IT rack cooling check of the first rack 1202 is equal to the maximum inlet temperature assessment and is set to "marginal," as illustrated in FIGS. 11 and 12A. In other examples, the additional rack information for a given rack may include assessments for the inlet and/or exhaust airflow, as discussed below with respect to FIGS. 13A-13C.

Figure 12B:
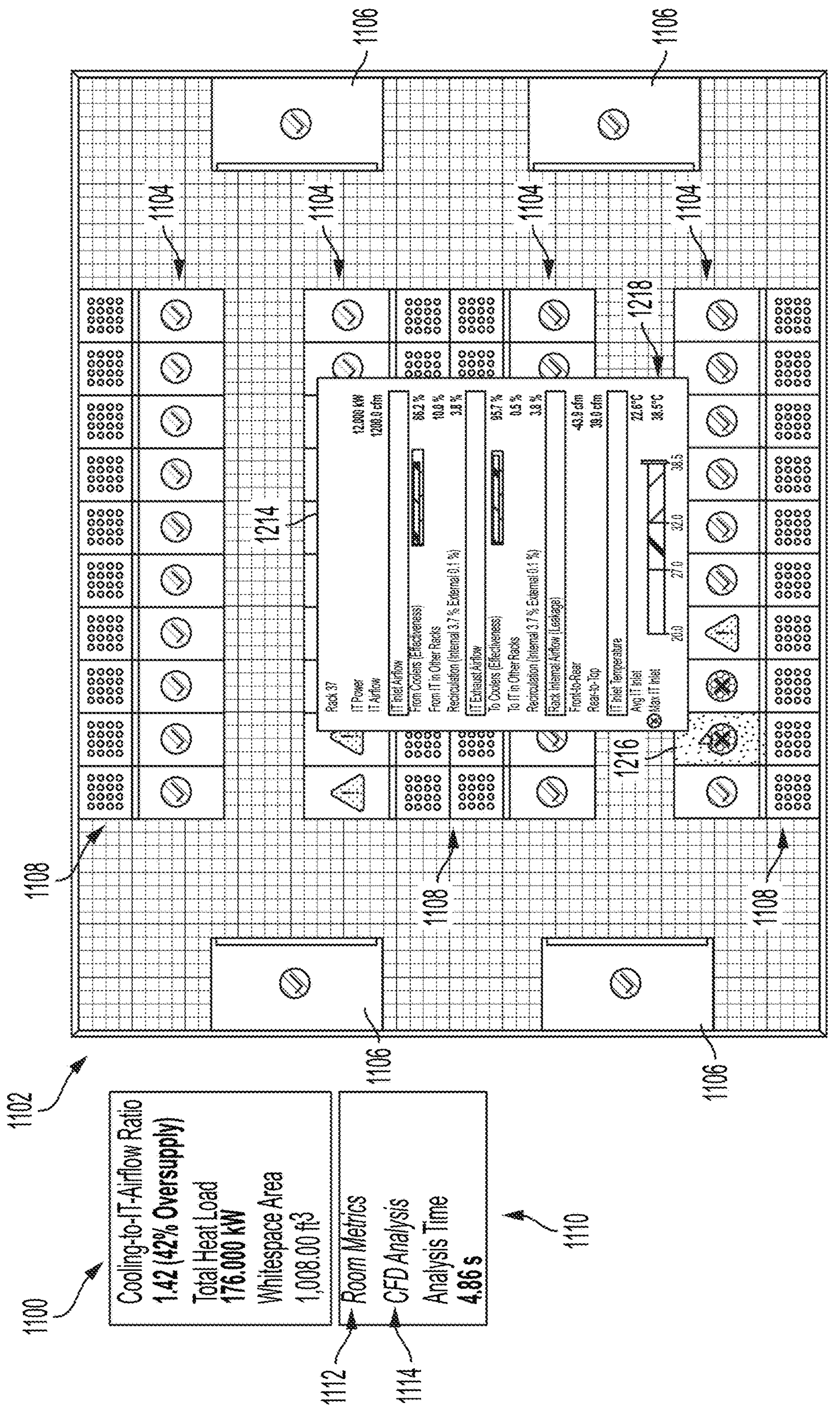
FIG. 12B illustrates a schematic diagram of a simulation display with additional rack information according to another example.

Returning to FIG. 11, a user may interact with other racks to display additional rack information for any of the other IT racks 1104. For example, FIG. 12B illustrates a schematic diagram of additional rack information 1214 for a second rack 1216, which may be displayed responsive to a user interacting with (for example, hovering a cursor over) the second rack 1216 of the IT racks 1104. The additional rack information 1214 includes rack-specific information for the second rack 1216, which may include similar or identical types of information as the additional rack information 1200 for the first rack 1202.

As indicated by inlet temperature information 1218 for the second rack 1216, the maximum inlet temperature for the second rack 1216 is greater than 32° C. Accordingly, a "bad" assessment symbol is illustrated next to the maximum inlet temperature for the second rack 1216. Furthermore, because the data center 1102 may be implemented according to an architecture with no containment, the overall IT rack cooling check for the second rack 1216 is also "bad."

In some examples, additional rack information for a given rack may include assessments for inlet and/or exhaust airflow depending, for example, on a containment type. For example, if exhaust-airflow containment is a design goal for a data center, then the exhaust airflow of a given rack may be evaluated and an exhaust-airflow assessment for the rack may be displayed in an additional-information panel.

Figure 13A:
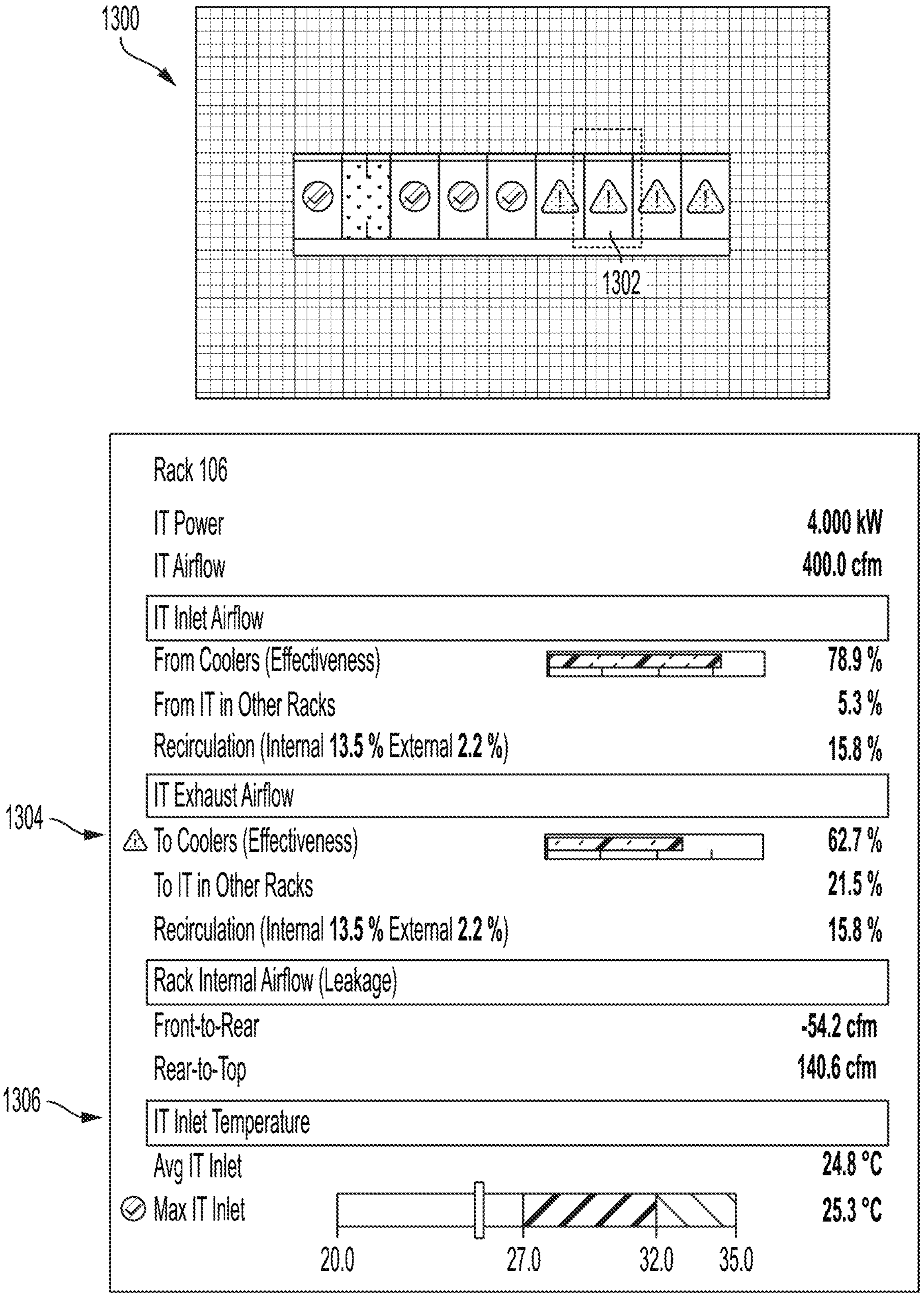
FIG. 13A illustrates a simulation display of additional rack information according to an example.

FIG. 13A illustrates a schematic diagram of additional rack information 1300 that may be displayed for a first rack 1302 according to another example. For example, the additional rack information 1300 may be displayed responsive to a user hovering a cursor over the first rack 1302. The additional rack information 1300 is similar to the additional rack information 1200, 1214 discussed above with respect to FIGS. 12A and 12B. However, the additional rack information 1300 includes an exhaust-airflow assessment 1304 in addition to a maximum inlet temperature assessment 1306. The exhaust-airflow assessment 1304 may be generated for the first rack 1302 because the first rack 1302 is implemented according to an exhaust-containment architecture, whereas the racks 1202, 1216 may be implemented according to an uncontained architecture.

As illustrated in FIG. 13A, the exhaust-airflow assessment 1304 indicates a "marginal" assessment for the effectiveness of 62.7%. As discussed above with respect to FIG. 4, assessments may be determined based on a range of values into which the effectiveness percentage falls. In some examples, the possible assessments may include "good," "marginal," and "bad" assessments, with the worst assessment may include a "bad" assessment. In other examples, the possible assessments may only include "good" and "marginal" assessments, such that the worst possible assessment may be a "marginal" assessment. Whereas temperature-based assessments may be based on specific regulations or guidelines (for example, ASHRAE specifications), airflow assessments may not be; accordingly, different assessment categories may be applicable to airflow assessments.

An overall IT rack cooling check for the first rack 1302 may be based on a lesser of the exhaust-airflow assessment 1304 and the maximum inlet temperature assessment 1306. Accordingly, although the maximum inlet temperature assessment 1306 includes a "good" assessment, the overall IT rack cooling check for the first rack 1302 may be "marginal" because the exhaust-airflow assessment 1304 is "marginal."

Figure 13B:
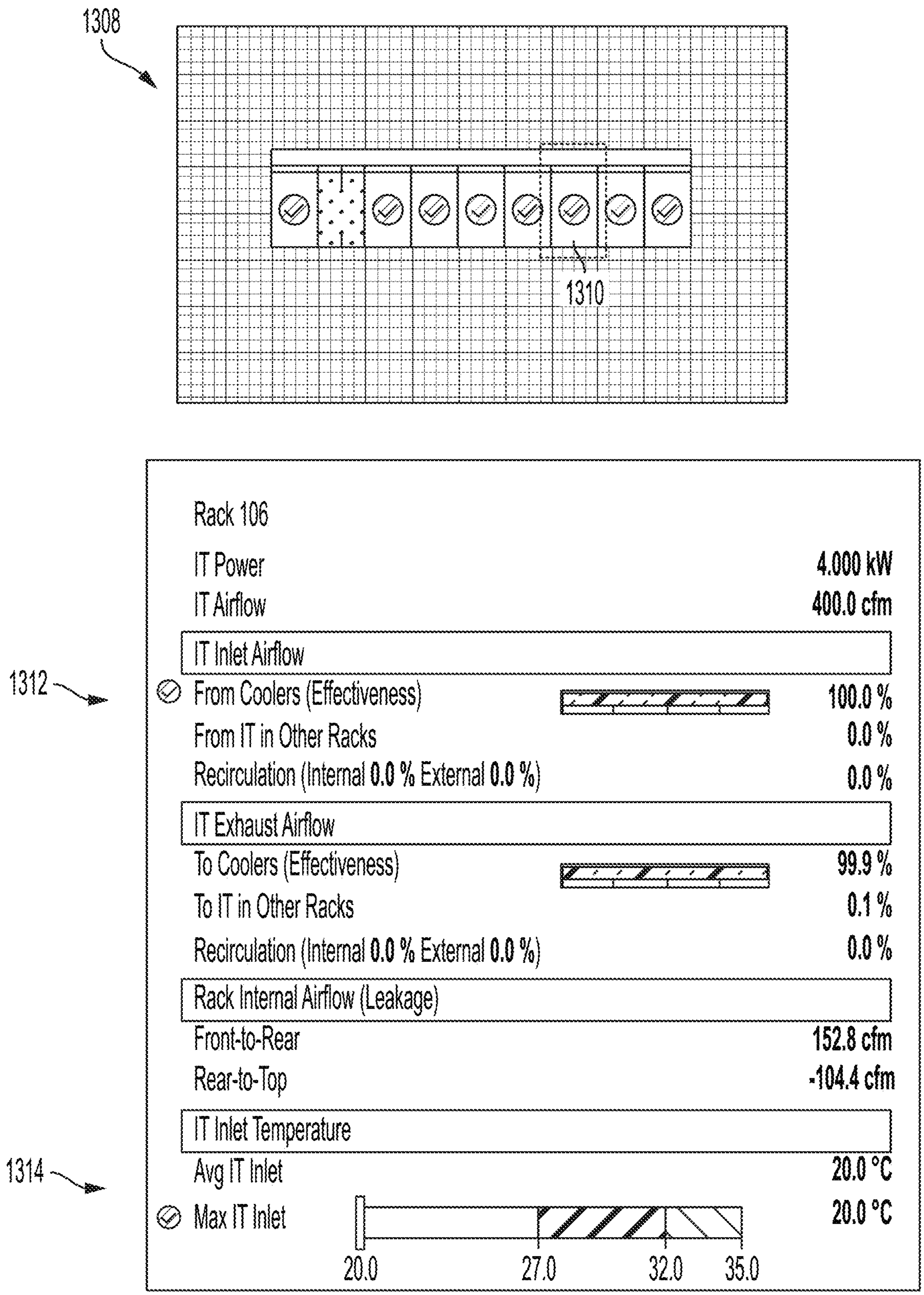
FIG. 13B illustrates a simulation display of additional rack information according to another example.

FIG. 13B illustrates a schematic diagram of additional rack information 1308 that may be displayed for a second rack 1310 according to an example. For example, the additional rack information 1308 may be displayed responsive to a user hovering a cursor over the second rack 1310. The additional rack information 1308 is similar to the additional rack information 1200, 1214 discussed above with respect to FIGS. 12A and 12B. However, the additional rack information 1308 includes an inlet-airflow assessment 1312 in addition to a maximum inlet temperature assessment 1314. The inlet-airflow assessment 1312 may be generated for the second rack 1310 because the second rack 1310 is implemented according to an inlet-containment architecture.

As illustrated in FIG. 13B, the inlet-airflow assessment 1312 indicates a "good" assessment for the effectiveness of 100%. As discussed above with respect to FIG. 4, assessments may be based on a range of values into which the effectiveness percentage falls. An overall IT rack cooling check for the second rack 1310 may be based on a lesser of the inlet-airflow assessment 1312 and the maximum inlet temperature assessment 1314. Accordingly, because both of the assessments 1312, 1314 are "good," the overall IT rack cooling check for the second rack 1310 may be "good."

Figure 13C:
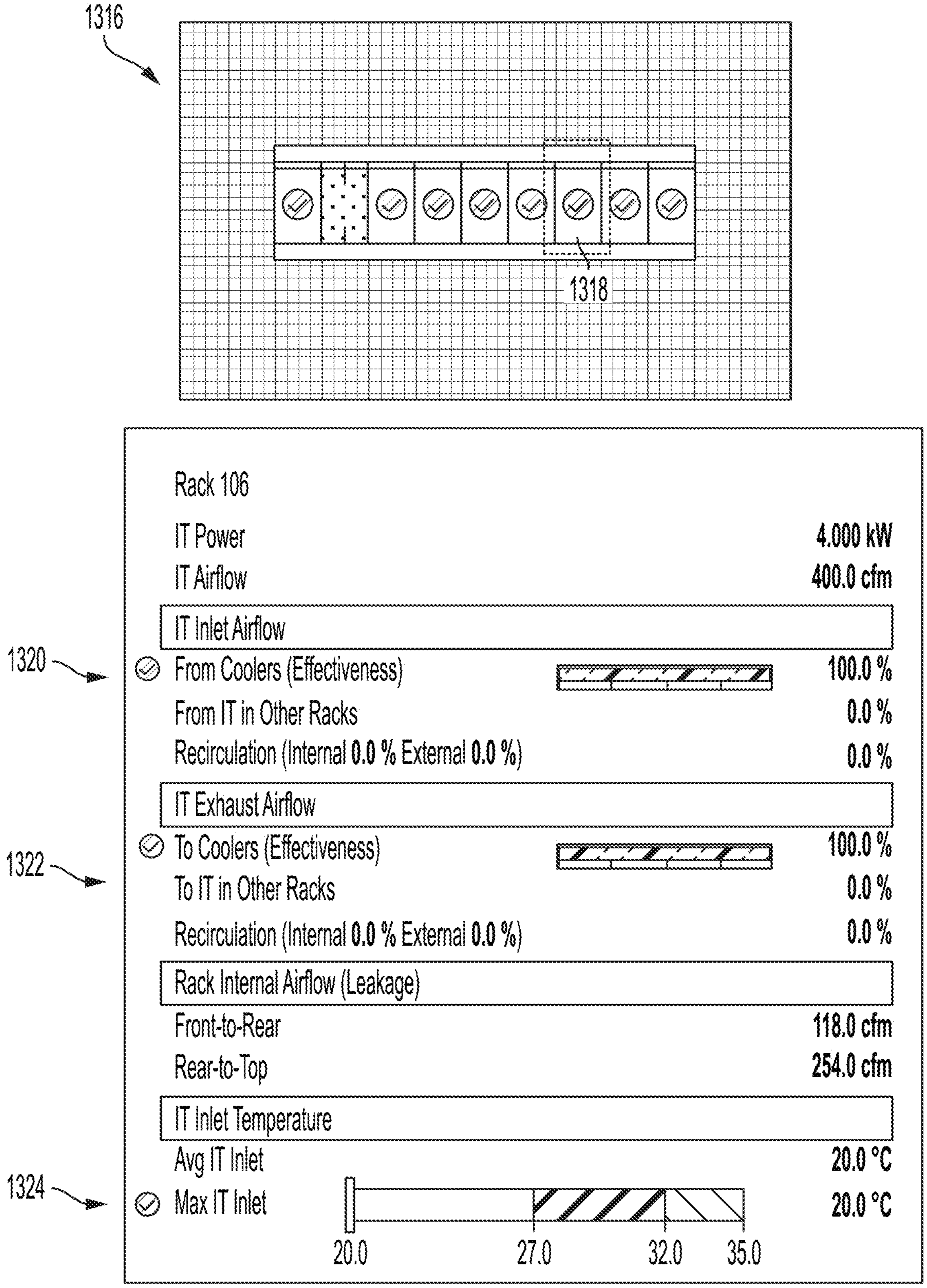
FIG. 13C illustrates a simulation display of additional rack information according to another example.

FIG. 13C illustrates a schematic diagram of additional rack information 1316 that may be displayed for a third rack 1318 according to an example. For example, the additional rack information 1316 may be displayed responsive to a user hovering a cursor over the third rack 1318. The additional rack information 1316 is similar to the additional rack information 1200, 1214 discussed above with respect to FIGS. 12A and 12B. However, the additional rack information 1316 includes an inlet-airflow assessment 1320 and an exhaust-airflow assessment 1322 in addition to a maximum inlet temperature assessment 1324. The inlet-airflow assessment 1320 and the exhaust-airflow assessment 1322 may be generated for the third rack 1318 because the third rack 1318 is implemented according to an inlet-and-exhaust containment architecture.

As illustrated in FIG. 13C, the inlet-airflow assessment 1320 indicates a "good" assessment for the effectiveness of 100%, and the exhaust-airflow assessment 1322 indicates a "good" assessment for the effectiveness of 100%. As discussed above with respect to FIG. 4, assessments may be based on a range of values into which the effectiveness percentage falls. An overall IT rack cooling check for the third rack 1318 may be based on a lesser of the inlet-airflow assessment 1320, the exhaust-airflow assessment 1322, and the maximum inlet temperature assessment 1324. Accordingly, because all of the assessments 1320-1324 are "good," the overall IT rack cooling check for the third rack 1318 may be "good."

Accordingly, as discussed with respect to FIGS. 13A-13C, an inlet-airflow and/or exhaust-airflow assessment may be generated depending at least on a containment architecture of a given rack. In some examples, an inlet-airflow and/or exhaust-airflow assessment may be generated for informational purposes even if the assessment(s) are not used to determine an IT rack cooling check. For example, even if a given rack is implemented according to an uncontained architecture, an inlet-airflow and/or exhaust-airflow assessment may be generated for informational purposes to the user. Informational assessments may be generated responsive to a user selection, may be generated automatically, and/or may not be generated in various examples.

As discussed above with respect to FIG. 11, the information panel 1110 may include room-metrics information 1112 and CFD-analysis information 1114. Interacting with the CFD-analysis information 1114 may include, for example, CFD accuracy information similar to the CFD accuracy metric 612. Interacting with the room-metrics information 1112 (for example, hovering over or clicking the room-metrics information 1112) may display additional information in a separate pane.

Figure 14:
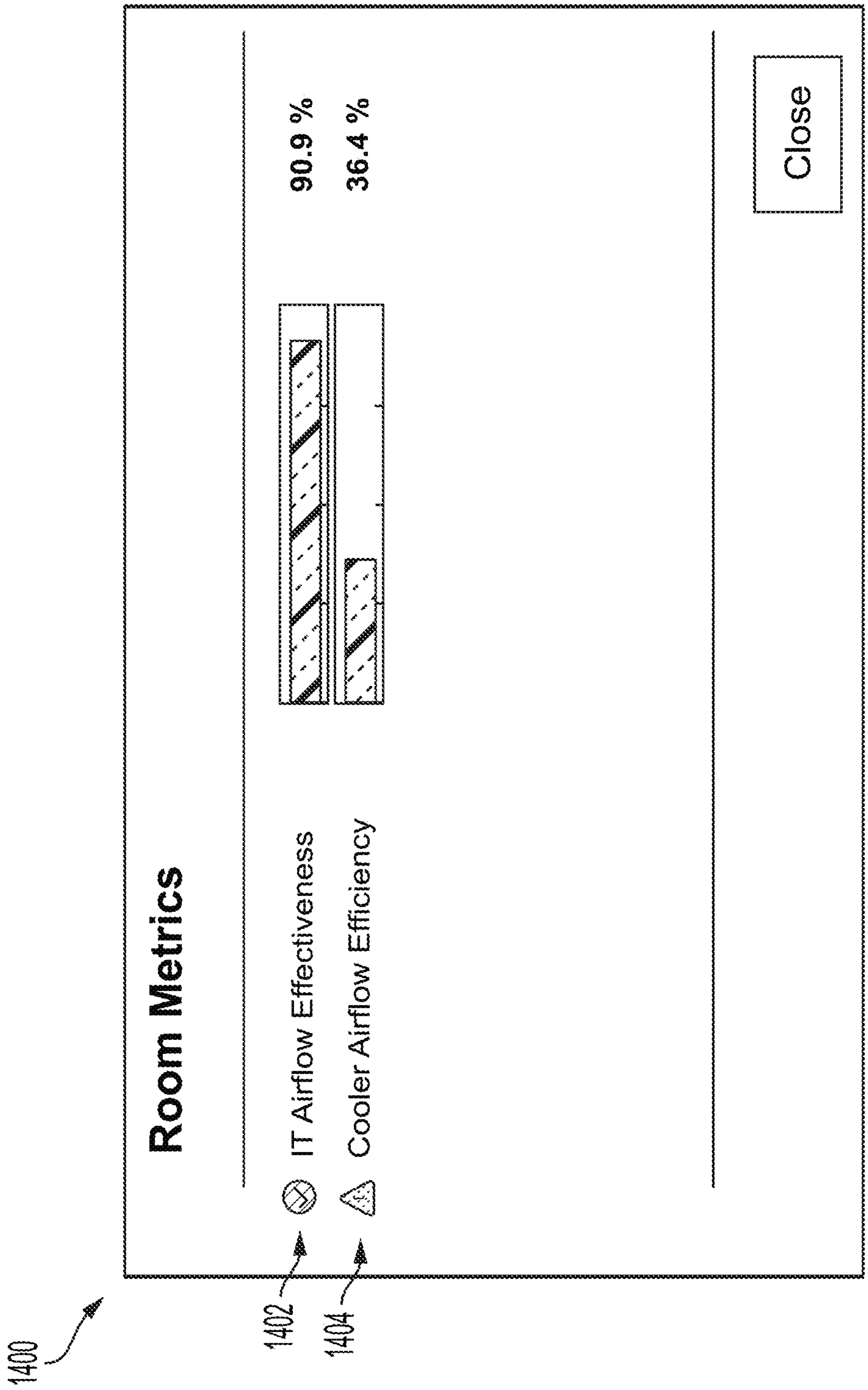
FIG. 14 illustrates an information panel of room-metrics information according to an example.

FIG. 14 illustrates a room-metrics information panel 1400 which may be displayed responsive to interacting with the room-metrics information 1112 according to an example. The room-metrics information panel 1400 includes airflow-effectiveness information 1402 and cooler airflow efficiency information 1404. In some examples, the room-metrics information panel 1400 may include additional information, such as an RCI metric. In various examples, the room-metrics information panel 1400 and/or the simulation display 1100 may display a cooling-effectiveness metric indicative of a worst one of the assessment in the airflow-effectiveness information 1402 and the cooling-performance assessments of the individual IT racks 1104, similar to the process 700.

The airflow-effectiveness information 1402 may include a percentage value indicating how effective airflow is provided and/or captured by the coolers 1106. In some examples an assessment of the effectiveness may be excluded, and in other examples the assessment may be included. For example, as illustrated in FIG. 14, the airflow-effectiveness information 1402 indicates that the airflow is 90.9% effective and an assessment has been included indicating that the 90.9% value is "good." The 90.9% airflow effectiveness value may be determined by considering the airflow effectiveness of each IT rack and weighting the airflow effectiveness values by respective IT rack airflow rates. For example, consider a first IT rack with a first airflow effectiveness and a second IT rack with a second airflow effectiveness. If the first IT rack has an airflow rate that is half that of the second IT rack, then the first airflow effectiveness will be weighted half as heavily as the second airflow effectiveness when determining a total airflow effectiveness for a space including the two IT racks.

In some examples, the airflow effectiveness displayed with the airflow-effectiveness information 1402 may include a thermal effectiveness in addition to, or in lieu of, the airflow effectiveness. In various examples, the thermal effectiveness may be equal to the airflow effectiveness. For example, the thermal effectiveness and airflow effectiveness values may be substantially equal when other sources of heat in a space (for example, breaker boxes or other heat sources that lack airflow) are either not present, or are correctly accounted for.

The thermal effectiveness ε for a given IT rack $IT_i$ may be expressed by Equation (7), $$\varepsilon_{ITi} = \frac{\dot{q}_{IT_i}}{\dot{q}_{c\to IT_i} + \dot{q}_{IT_i}} = \frac{\Delta T_{IT_i}}{\Delta T_{max_i}} \tag{7}$$

where $\dot{q}_{IT_i}$ is the power dissipated as heat by a given IT rack i, $\dot{q}_{c\to IT_i}$ is the rate of energy addition by mixing to the airflow stream originating at a cooler supply and passing through the rack i, $\Delta T_{IT_i}$ is a temperature difference between the exhaust of the rack i and the inlet air of the rack i, and $\Delta T_{max_i}$ is a temperature difference between the exhaust of the rack i and the supply air provided by a cooling unit.

Using the thermal effectiveness c for each of n racks in a space (for example, each rack in a data center) weighted by a respective energy flow, and factoring in the heat generated by all p additional heat loads $\dot{q}_k$ (for example, circuit breakers and other such "heat boxes" which may lack airflow and may be modeled as a simple heat source) in the space, the overall thermal effectiveness value $\varepsilon_{ITt}$ for a space may be expressed by Equation (8), $$\varepsilon_{ITt} = \frac{\sum_{i=1}^{n} (\rho c_p Q_{IT_i} \Delta T_{max_i}) \varepsilon_{ITi} + \sum_{k=1}^{p} \dot{q}_k}{\sum_{i=1}^{n} \rho c_p Q_{IT_i} \Delta T_{max_i} + \sum_{k=1}^{p} \dot{q}_k} \tag{8}$$

where $\rho c_p Q_{IT_i} \Delta T_{max_i} = \dot{q}_{ITi} / \varepsilon_{ITi}$. Accordingly, the overall thermal effectiveness value $\varepsilon_{ITt}$ represented by Equation (8) represents a thermal effectiveness for a space as a whole, and may be part of the airflow-effectiveness information 1402 for the given space. For example, the airflow-effectiveness value indicated in the airflow-effectiveness information 1402 may be equal to the thermal-effectiveness value, and thus the thermal-effectiveness value calculated pursuant to Equation (8) may be displayed as the airflow-effectiveness value in the airflow-effectiveness information 1402. In other examples, the airflow-effectiveness information 1402 may include both an airflow-effectiveness value and a thermal-effectiveness value. In still other examples, the airflow-effectiveness information 1402 may include only the thermal-effectiveness value, whether or not the thermal-effectiveness value is equal to the airflow-effectiveness value.

Accordingly, examples of the disclosure enable CFD simulations to be executed to analyze temperature and airflow patterns in a space. For example, CFD simulations may be executed to analyze temperature and airflow patterns in a data center including IT racks and coolers. A simulation display may illustrate, amongst other information, a cooling assessment for each rack. An indication of each assessment may be overlaid on each IT rack. Interacting with a rack (for example, hovering a cursor over a rack) may display additional rack information. For example, such additional rack information may include an inlet-airflow effectiveness and, optionally, an assessment thereof, an exhaust-airflow effectiveness and, optionally, an assessment thereof, and/or temperature information and, optionally, an assessment thereof. The IT rack cooling assessment may be based at least in part on these component assessments. Using the cooling effectiveness for each rack, an overall cooling-effectiveness metric for the data center as a whole may be generated by weighting each effectiveness value by respective energy flows indicating an amount of energy flowing through each respective rack. The overall room cooling-effectiveness metric may be expressed as a percentage value and, in some examples, may be accompanied by an assessment.

As noted above, an indication of each assessment may be displayed in associated with a respective IT rack. For example, an indication of an assessment (for example, a green checkmark, a yellow caution symbol, and so forth) may be overlaid on a corresponding IT rack in a simulation display. In another example, an indication of each assessment may be displayed in association with a respective rack through a different scheme. For example, a simulation display may include a list of IT-rack identifiers (for example, a list of IT-rack names, model numbers, locations, or other identifiers which may aid in identifying a corresponding IT rack) and a corresponding indication of an assessment displayed alongside a corresponding IT-rack identifier. In still other examples, other means of displaying an indication of an IT rack in connection with an indication of an IT-rack assessment may be implemented.

In various examples, indications of assessments may be displayed with a symbol and a color, such as a green checkmark, a yellow caution symbol, a red "X," and so forth. In the accompanying black-and-white drawings, indications may include a checkmark against a hatched background, a caution symbol against a dotted background, and an "X" against a hexagonal background. In various examples, however, a display may depict these illustrations with colored backgrounds in addition to, or in lieu of, differently patterned backgrounds.

Various controllers, such as a controller within a computing device (for example, a server) configured to execute the CFD software discussed above, may execute various operations discussed above. Using data stored in associated memory and/or storage, the controller also executes one or more instructions stored on one or more non-transitory computer-readable media, which the controller may include and/or be coupled to, that may result in manipulated data. In some examples, the controller may include one or more processors or other types of controllers. In one example, the controller is or includes at least one processor. In another example, the controller performs at least a portion of the operations discussed above using an application-specific integrated circuit tailored to perform particular operations in addition to, or in lieu of, a general-purpose processor. As illustrated by these examples, examples in accordance with the present disclosure may perform the operations described herein using many specific combinations of hardware and software and the disclosure is not limited to any particular combination of hardware and software components. Examples of the disclosure may include a computer-program product configured to execute methods, processes, and/or operations discussed above. The computer-program product may be, or include, one or more controllers and/or processors configured to execute instructions to perform methods, processes, and/or operations discussed above.

What is claimed is:

1. A non-transitory computer-readable medium storing thereon sequences of computer-executable instructions for assessing cooling in a space containing one or more units of information technology (IT) equipment and one or more cooling units, the sequences of computer-executable instructions including instructions that instruct at least one processor to:

receive information-technology-device information indicative of the one or more units of IT equipment, the information-technology-device information including information-technology-device-location information and temperature information;

determine, for each unit of IT equipment of the one or more units of IT equipment based on the information-technology-device information, an IT-equipment-cooling assessment;

receive cooling-unit information indicative of at least one of air output by the one or more units of IT equipment to the one or more cooling units or air provided by the one or more cooling units to the one or more units of IT equipment;

determine, based on the cooling-unit information, at least one of a cooling-airflow-return effectiveness or a cooling-airflow-supply effectiveness, the cooling-airflow-return effectiveness being indicative of the quantity air output by the one or more units of IT equipment to the one or more cooling units in relation to the quantity of air output by the one or more cooling units to the one or more units of IT equipment, and the cooling-airflow-supply effectiveness being indicative of the quantity air output by the one or more cooling units to the one or more units of IT equipment in relation to the quantity of air output by the one or more units of IT equipment to the one or more cooling units; and display, via a user interface:

a simulation display depicting the one or more units of IT equipment, an effectiveness indicator for the at least one of the cooling-airflow-return effectiveness or the cooling-airflow-supply effectiveness, and a respective IT indicator for each IT-equipment-cooling assessment, wherein each respective IT indicator is displayed in association with a respective unit of IT equipment to which the respective IT indicator corresponds.

2. The non-transitory computer-readable medium of claim 1, wherein the cooling-airflow-return effectiveness is indicative of a percentage of air output by the one or more units of IT equipment that is directly captured by the one or more cooling units.

3. The non-transitory computer-readable medium of claim 2, wherein being directly captured by the one or more cooling units includes the air output by the one or more units of IT equipment being captured by the one or more cooling units without first passing through other devices capable of changing a temperature of the air.

4. The non-transitory computer-readable medium of claim 1, wherein the cooling-airflow-supply effectiveness is indicative of a percentage of air that is supplied by the one or more cooling units directly to the one or more units of IT equipment.

5. The non-transitory computer-readable medium of claim 4, wherein being directly supplied to the one or more cooling units includes the air output by the one or more cooling units being provided to the one or more units of IT equipment without first passing through other devices capable of changing a temperature of the air.

6. The non-transitory computer-readable medium of claim 1, wherein determining the at least one of the cooling-airflow-return effectiveness or the cooling-airflow-supply effectiveness is based on every unit of IT equipment in the space.

7. The non-transitory computer-readable medium of claim 1, wherein determining the at least one of the cooling-airflow-return effectiveness or the cooling-airflow-supply effectiveness includes weighting an airflow rate of each of the one or more units of IT equipment.

8. A method of assessing cooling in a space containing one or more units of information technology (IT) equipment and one or more cooling units, the method comprising:
- receiving information-technology-device information indicative of the one or more units of IT equipment, the information-technology-device information including information-technology-device-location information and temperature information;
- determining, for each unit of IT equipment of the one or more units of IT equipment based on the information-technology-device information, an IT-equipment-cooling assessment;
- receiving cooling-unit information indicative of at least one of air output by the one or more units of IT equipment to the one or more cooling units or air provided by the one or more cooling units to the one or more units of IT equipment;
- determining, based on the cooling-unit information, at least one of a cooling-airflow-return effectiveness or a cooling-airflow-supply effectiveness, the cooling-airflow-return effectiveness being indicative of the quantity air output by the one or more units of IT equipment to the one or more cooling units in relation to the quantity of air output by the one or more cooling units to the one or more units of IT equipment, and the cooling-airflow-supply effectiveness being indicative of the quantity air output by the one or more cooling units to the one or more units of IT equipment in relation to the quantity of air output by the one or more units of IT equipment to the one or more cooling units; and
- displaying, via a user interface:
  - a simulation display depicting the one or more units of IT equipment,
  - an effectiveness indicator for the at least one of the cooling-airflow-return effectiveness or the cooling-airflow-supply effectiveness, and
  - a respective IT indicator for each IT-equipment-cooling assessment, wherein each respective IT indicator is displayed in association with a respective unit of IT equipment to which the respective IT indicator corresponds.

9. The method of claim 8, wherein the cooling-airflow-return effectiveness is indicative of a percentage of air output by the one or more units of IT equipment that is directly captured by the one or more cooling units.

10. The method of claim 9, wherein being directly captured by the one or more cooling units includes the air output by the one or more units of IT equipment being captured by the one or more cooling units without first passing through other devices capable of changing a temperature of the air.

11. The method of claim 8, wherein the cooling-airflow-supply effectiveness is indicative of a percentage of air that is supplied by the one or more cooling units directly to the one or more units of IT equipment.

12. The method of claim 11, wherein being directly supplied to the one or more cooling units includes the air output by the one or more cooling units being provided to the one or more units of IT equipment without first passing through other devices capable of changing a temperature of the air.

13. The method of claim 8, wherein determining the at least one of the cooling-airflow-return effectiveness or the cooling-airflow-supply effectiveness is based on every unit of IT equipment in the space.

14. The method of claim 8, wherein determining the at least one of the cooling-airflow-return effectiveness or the cooling-airflow-supply effectiveness includes weighting an airflow rate of each of the one or more units of IT equipment.

15. A system comprising:
- one or more units of information technology (IT) equipment in a space;
- one or more cooling units in the space; and
- at least one processor coupled to memory and/or storage and being configured to:
  - receive information-technology-device information indicative of the one or more units of IT equipment, the information-technology-device information including information-technology-device-location information and temperature information;
  - determine, for each unit of IT equipment of the one or more units of IT equipment based on the information-technology-device information, an IT-equipment-cooling assessment;
  - receive cooling-unit information indicative of at least one of air output by the one or more units of IT equipment to the one or more cooling units or air provided by the one or more cooling units to the one or more units of IT equipment;
  - determine, based on the cooling-unit information, at least one of a cooling-airflow-return effectiveness or a cooling-airflow-supply effectiveness, the cooling-airflow-return effectiveness being indicative of the quantity air output by the one or more units of IT equipment to the one or more cooling units in relation to the quantity of air output by the one or more cooling units to the one or more units of IT equipment, and the cooling-airflow-supply effectiveness being indicative of the quantity air output by the one or more cooling units to the one or more units of IT equipment in relation to the quantity of air output by the one or more units of IT equipment to the one or more cooling units; and
  - display, via a user interface:
    - a simulation display depicting the one or more units of IT equipment, an effectiveness indicator for the at least one of the cooling-airflow-return effectiveness or the cooling-airflow-supply effectiveness, and a respective IT indicator for each IT-equipment-cooling assessment, wherein each respective IT indicator is displayed in association with a respective unit of IT equipment to which the respective IT indicator corresponds.

16. The system of claim 15, wherein the cooling-airflow-return effectiveness is indicative of a percentage of air output by the one or more units of IT equipment that is directly captured by the one or more cooling units.

17. The system of claim 16, wherein being directly captured by the one or more cooling units includes the air output by the one or more units of IT equipment being captured by the one or more cooling units without first passing through other devices capable of changing a temperature of the air.

18. The system of claim 15, wherein the cooling-airflow-supply effectiveness is indicative of a percentage of air that is supplied by the one or more cooling units directly to the one or more units of IT equipment.

19. The system of claim 18, wherein being directly supplied to the one or more cooling units includes the air output by the one or more cooling units being provided to the one or more units of IT equipment without first passing through other devices capable of changing a temperature of the air.

20. The system of claim 15, wherein determining the at least one of the cooling-airflow-return effectiveness or the cooling-airflow-supply effectiveness is based on every unit of IT equipment in the space and includes weighting an airflow rate of every unit of IT equipment.

* * * * *